(12) United States Patent
Goyal

(10) Patent No.: US 7,087,113 B2
(45) Date of Patent: Aug. 8, 2006

(54) TEXTURED SUBSTRATE TAPE AND DEVICES THEREOF

(75) Inventor: Amit Goyal, Knox, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 115 days.

(21) Appl. No.: 10/189,678

(22) Filed: Jul. 3, 2002

(65) Prior Publication Data

US 2004/0003768 A1    Jan. 8, 2004

(51) Int. Cl.
*C30B 1/10* (2006.01)

(52) U.S. Cl. .......................... 117/84; 117/108; 505/473; 505/475; 428/655

(58) Field of Classification Search ............... 117/84, 117/108; 505/473, 475; 428/548, 655, 674
See application file for complete search history.

(56) References Cited

U.S. PATENT DOCUMENTS

| | | |
|---|---|---|
| 5,739,086 A | 4/1998 | Goyal et al. |
| 5,741,377 A | 4/1998 | Goyal et al. |
| 5,898,020 A | 4/1999 | Goyal et al. |
| 5,944,966 A | 8/1999 | Suetsugu et al. |
| 5,958,599 A | 9/1999 | Goyal et al. |
| 6,106,615 A * | 8/2000 | Goyal et al. .................. 117/84 |
| 6,455,166 B1 | 9/2002 | Truchan et al. |

OTHER PUBLICATIONS

Dimos, D., et al. "*Orientation Dependence of Grain-Boundary Critical Currents in $YBa_2Cu_3O_{7-\delta}$ Bicrystals*" Physical Review Letters, vol. 61, No. 2, Jul. 11, 1988, pp. 219-222.

Dimos, D., et al. "*Superconducting Transport Properties of Grain Boundaries in $YBa_2Cu_3O_7$ Bicrystals*" Physical Review B. vol. 41, No. 7, Mar. 1, 1990, pp. 4038-4049.

Cardona, A.H., et al. "*Transport Characteristics of $Tl_2Ba_2CaCu_2O_4$ Bicrstyal Grain Boundary Junctions at 77 $K^{\degree}$*", Appl. Phys. Lett. 62(4). Jan. 25, 1993, pp. 411-413.

(Continued)

*Primary Examiner*—Robert Kunemund
(74) *Attorney, Agent, or Firm*—Akerman Senterfitt; Neil R. Jetter

(57) ABSTRACT

A method for forming a sharply biaxially textured substrate, such as a single crystal substrate, includes the steps of providing a deformed metal substrate, followed by heating above the secondary recrystallization temperature of the deformed substrate, and controlling the secondary recrystallization texture by either using thermal gradients and/or seeding. The seed is selected to shave a stable texture below a predetermined temperature. The sharply biaxially textured substrate can be formed as a tape having a length of 1 km, or more. Epitaxial articles can be formed from the tapes to include an epitaxial electromagnetically active layer. The electromagnetically active layer can be a superconducting layer.

73 Claims, 19 Drawing Sheets

OTHER PUBLICATIONS

Kawasaki, M., et al. "*Weak Link Behavior of Grain Boundaries In Nd-, Bi-, and Ti-based Cuprate Superconductors*" *Appl. Phys. Lett.* 62(4), Jan. 25, 1993. pp. 417-419.

Nabatame, T., et al. "*Transport Superconducting Properties of Grain Boundaries in $Tl_1Ba_2Ca_2Cu_3O_2$ Thin Films*" *Appl. Phys. Lett.* 65(6), Aug. 8, 1994, pp. 776-778.

Tomita, N., et al. "*The Superconducting Properties of [001] Twist Boundaries in a Bi-Sr-Ca-Cu-O Superconductor*", *Jpn. J. Appl. Phys.* vol. 31 (1992), pp. L942-L945.

Wang, J., et al. "Electromagnetic Coupling Character of [001] Twist Boundaries in Sintered $Bi_2Sr_2CaCu_2O_{8-2}$ Bicrystals" *Physica C 230* (1994), pp. 189-198.

Lijima, Y., et al. "Structural and Transport Properties of Biaxially Aligned $YBa_2Cu_3O_{7-4}$ Films on Polycrystalline Ni-based Alloy with Ion-Beam-Modified Buffer Layers" *J. Appl. Phys.* 74(3), Aug. 1, 1993, pp. 1905-1911.

Reade, R.P., et al. "*Laser Deposition of Biaxially Textured Yuria-Stabilized Zirconia Buffer Layers on Polycrystalline Metallic Alloys for High Critical Current Y-Ba-Cu-O Thin Films*" *Appl. Phys. Lett* 51(18), Nov. 2, 1992, pp. 2231-2233.

Wu, X.D., et al. "*High Current $YBa_2Cu_3O_7$ Thick Films on Flexible Nickel Substrates with Textured Buffer Layers*", *Appl. Phys. Lett.* 65 (15), Oct. 10, 1994, pp. 1961-1963.

Goyal, A., et al. "*Conductors with Controlled Grain Boundaries: An Approach to the Next Generation, High Temperature Superconducting Wire*" *J. Mater., Res.*, vol. 12, No. 11, Nov. 1997, pp. 2924-2940.

Feenstra, et al. "*Effect of Oxygen Pressure on the Synthesis of YBa2Cu307-x Thin Films by Post-Deposition Annealing*", *J. Appl. Phys.* 69 (9), May 1991, pp. 6569-6584.

Goyal, et al. *Textured Formation and Grain Boundary Networks in Rolling Assisted Biaxially Textured Substrates and in Epitaxial YBCO Films on Such Substrates, Micron 30* (1990) pp. 463-478; and.

Cantoni, et al. "*Reflection High-Energy Electron Diffraction Studies of Epitaxial Oxide Seed-Layer Growth on Rolling-Assisted Biaxially Textured Substrate Ni(001): The Role of Surface Structure and Chemistry*", *Applied Physics Letters*, vol. 79, No. 19, Nov. 2001, pp. 3077-3079.

* cited by examiner

US 7,087,113 B2

TEXTURED SUBSTRATE TAPE AND DEVICES THEREOF

STATEMENT REGARDING FEDERALLY SPONSORED RESEARCH OR DEVELOPMENT

The United States Government has rights in this invention pursuant to Contract No. DE-AC05-00OR22725 between the United States Department of Energy and UT-Battelle, LLC.

FIELD OF THE INVENTION

The invention relates to biaxially-textured metallic substrates and articles made therefrom, and more particularly to such substrates and articles made by depositing epitaxial materials thereon.

BACKGROUND OF THE INVENTION

Many device applications require control of the grain boundary character of polycrystalline materials which form part of the device. For example, in high temperature superconductors (HTS) grain boundary characteristics are important. The significant effect of grain boundary characteristics on current transmission across superconductor grain boundaries has been clearly demonstrated for $YBa_2Cu_3O_{7x}$ (Y123). For clean, stoichiometric boundaries, the grain boundary critical current $J_c$ (gb) appears to be determined primarily by the grain boundary misorientation. The dependence of $J_c$ (gb) on misorientation angle has been determined by Dimos et al. [1] in Y123 for several grain boundary types, which can be formed in epitaxial films on bicrystal substrates. These include [001] tilt, [100] tilt, and [100] twist boundaries [1]. In each case, high angle grain boundaries were found to be weak-linked. The $J_c$ value decreases exponentially with increasing grain boundary misorientation angle in artificially fabricated bicrystals of YBCO films [1]. The low $J_c$ observed in randomly oriented polycrystalline Y123 can be explained by the small percentage of low angle boundaries, the high angle grain boundaries impeding long-range current flow.

Recently, the Dimos experiment has been extended to artificially fabricated [001] tilt bicrystals in $Tl_2Ba_2CaCu_2O_8$ [2], $Tl_2Ba_2Ca_2Cu_3O_x$ [3], $TlBa_2Ca_2Cu_2O_x$ [4] and $Nd_{1.85}Ce_{0.15}CuO_4$ [3]. In each case it was found that, as in Y123, $J_c$ depends strongly on the distribution of grain boundary misorientation angles. Although no such measurements have yet been made on Bi-2223, data on current transmission across artificially fabricated grain boundaries in Bi-2212 indicates that most large [001] tilt [3] and twist [5,6] grain boundaries are weak links, with the exception of some coincident site lattice (CSL) related boundaries [5,6]. It is likely that the variation in $J_c$ with grain boundary misorientation in Bi-2212 and Bi-2223 will be similar to that observed in the well characterized cases of Y123 and Tl-based superconductors. Hence in order to fabricate high temperature superconductors with very high critical current densities, it is necessary to biaxially align the grains to produce a high percentage of low angle grain boundaries. This has been shown to result in significant improvement in the superconducting properties of YBCO films [7–10].

A simple method to fabricate long lengths of textured substrates with primarily low-angle grain boundaries for epitaxial deposition of high temperature superconducting (HTS) materials is disclosed by Goyal et al. [10]. This method is known as Rolling-Assisted-Biaxially-Textured-Substrates (RABiTS). Four U.S. patents have been issued on this process and related process variants (U.S. Pat. Nos. 5,739,086, 5,741,377, 5,898,020, 5,958,599 and 5,944,966). In the RABiTS method, the substrate formed is a polycrystalline substrate having primarily low angle grain boundaries.

In the above referenced patents and related papers, a metal or metal alloy is first heavily deformed and then annealed at a temperature above its primary recrystallization temperature, but below its secondary recrystallization temperature. This results in the formation of a sharp {100}<100> cube texture. Annealing of the substrate above its secondary recrystallization temperature is avoided since off-cube orientations appear and result in the formation of high angle grain boundaries. As noted above, substrates having high angle grain boundaries are undesirable for most device applications, such as superconducting devices.

SUMMARY OF THE INVENTION

The invention provides a method for the fabrication of sharply biaxially textured metallic substrates capable of formation into substrate tapes, and articles formed thereof. As used herein, the phrase "sharply biaxially textured" is defined herein to mean a texture that approaches the texture provided by a bulk single crystal. A bulk article which is sharply biaxially textured has a crystallographic orientation such that the bulk substrate provides a full-width-half maximum within 7° throughout the crystal, preferably within 5°, and more preferably within 3°.

The invention also provides a method for the fabrication of single grained metallic substrates tapes, and articles formed thereof. As used herein, the phrase "single grain" and "single crystal" are defined herein as having only one grain, as opposed to polycrystalline which includes a plurality of grains. The definition of a grain is a compositionally homogeneous region of material which has the same orientation in all directions. However, sub-grain boundaries can occur within a grain. These are typically less than 1–2 degrees in misorientation. For a large grain, however, one can have a series of sub-grain boundaries which can make the total FWHM of the grain larger, such as from 5 to 7 degrees. Both single grain and single crystal substrates are biaxially textured by definition.

The term "tape" is defined herein to mean an article having a length of at least 0.1 m, but preferably having a length of up to 1 km, or more. For example, tape lengths can be at least 0.1 m, 0.6 m, 1 m, 10 m, 100 m or at least 1 km.

Tapes are generally thin articles, resulting from deformation processing, such as rolling and drawing, which can be used to achieve the relatively long lengths required by tape articles. For example, a tape article, sometimes referred to as a wire, which is well suited for use by the electric power industry for the formation of superconducting power transmission lines, may have dimension of 50 µm thick, 1 cm wide and 50–100 m long.

Epitaxial deposition of one or more layers on the sharply biaxially textured metallic substrates producible by the invention allows for the fabrication of high performance materials for a variety of applications. For example, numerous devices having at least one electromagnetically active layer may be disposed on the sharply biaxially textured metallic substrates provided by the invention, such as superconducting tapes and devices formed as a result, other superconducting electronic thin-film based devices. In addition, photovoltaic or solar cell devices, ferroelectric devices, piezoelectric devices, and other electromagnetic devices where high angle-grain boundaries are undesirable or deleterious to desired properties can benefit from the invention.

A method for forming single grained substrates and/or biaxially textured substrates includes the steps of providing a deformed metal substrate with a very well-developed Cu-type rolling texture. A substrate with a Cu-type rolling texture can be easily identified as shown in FIGS. 1–6 and the associated discussions, or by reviewing reference 11. For a Cu-type rolling texture, the X-ray intensity in the pole figures is concentrated on the β-fiber in Euler Space of orientation representation. Cu-type rolling texture is generally best shown using pole figures of (111), (200) and (220) from the substrate or drawing the orientations in Euler Space.

FIG. 1 shows a schematic representation of the rolling texture possibilities in FCC metals in the first subspace of Euler Space. The most important observation to be derived from FIG. 1 is that the rolling texture of FCC metals and alloys is represented by a continuous tube or fiber of orientations which runs from {110}<112>, the brass point (B) at $\phi_1=35°$, $\phi=45°$ and $\phi_2=90°$ through {123}<634> (S) at $\phi_1=59°$, $\phi=37°$ and $\phi_2=63°$ to {112}<111>, and the copper point (C) at $\phi_1=90°$, $\phi=35°$ and $\phi_2=45°$. This tube or fiber running from the B through the S to the C point in Euler space is called the β-fiber. When an FCC metal is rolled appropriately to form an adequate precursor to the cube texture upon annealing, essentially no intensity is present along the β-fiber which runs from the Goss point (G) at $\phi_1=0°$, $\phi=45°$ and $\phi_2=90°$ to the brass point (B) at $\phi_1=35°$, $\phi=45°$ and $\phi_2=90°$.

The pole figures shown in FIGS. 2–5 represent intensity solely along the β-fiber. This texture is referred to as the Cu-type rolling texture. FIG. 2 shows a Ni (111) pole figure, FIG. 3 a Ni (200) pole figure, while FIG. 4 is a Ni (110) pole figure for as-rolled material. These pole figures were taken using X-ray diffraction. Alternatively, one can obtain the same information using electron backscatter kikuchi diffraction [11].

All three pole figures can be obtained from electron backscatter kikuchi diffraction. FIG. 5 shows (111), (110), (100) pole figures from the surface of an as-rolled Ni tape with a Cu-type rolling texture obtained using electron backscatter kikuchi diffraction.

From electron backscatter data (FIG. 5) or from the three pole figures obtained using X-ray diffraction (FIGS. 2–4), the orientation distribution function (ODF) can be obtained which is shown in FIG. 6 below in Euler space. FIG. 6 is a log scale, contour representation of the three dimensional orientation distribution function for the as-rolled Ni sample. These are essentially sections of a space similar to that shown in FIG. 1 for constant $\phi_2$.

In summary, an as-rolled FCC metal is referred to having a Cu-type texture if the orientation of all the grains in the material lie on the β-fiber as described from an orientation perspective at the beginning of this discussion.

Annealing the metal tape at a temperature higher than its secondary recrystallization temperature can provide exaggerated grain growth so that a single grain consumes all other grains to form an effectively "single grain" or "single crystal" material. The annealing step can include translating the deformed substrate through a heated zone. The heated zone can include a temperature gradient. The heated zone can be provided by resistive heating, electron beams, laser beams, or infrared or induction heating. Translation through the heated zone can be discontinuous or continuous. The deformed metal substrate can include Cu, Co, Mo, Cd, Pd, Pt, Ag, Al and Ni, and alloys thereof. In one embodiment, the deformed metal substrate includes Ni and Ni-based alloys with at least one alloying agent selected from the group consisting of Al, Co, Cr, Cu, Fe, V, Mo, W, and rare earth elements.

The method can include the step of forming an epitaxial native oxide layer by thermal oxidation of the single crystal substrate. Such epitaxial native oxide layers may be beneficial for the deposition of subsequent epitaxial oxide layers of interest. The method can also include a step of first depositing an epitaxial nitride layer on the single crystal metal tape, followed by oxidating of the nitride layer to form an epitaxial oxide layer.

The method can include the step of depositing an electromagnetically active epitaxial layer on the single crystal substrate. The electromagnetically active layer can be a superconducting layer, a photovoltaic layer or a ferroelectric layer. The superconducting layer can comprise an oxide superconductor, such as $REBa_2Cu_3O_7$, where RE is a rare earth element; $Tl_1Ba_2Ca_{n-1}Cu_nO_{2n+3}$, where n is an integer between 1 and 4; $Tl_2Ba_2Ca_{n-1}Cu_nO_{2n+4}$, where n is an integer between 1 and 4; and $Hg_1Ba_2Ca_{n-1}Cu_nO_{2n+2}$, where n is an integer between 1 and 4.

The method can include the step of depositing at least one epitaxial buffer layer on and in contact with the surface of the single crystal substrate, and depositing an epitaxial electromagnetically active layer on the buffer layer. The buffer layer can be one or more layers selected from $CeO_2$, YSZ, $Y_2O_3$, $LaAlO_3$, $SrTiO_3$, Nb-doped, $SrTiO_3$, RE2O3, where RE is a rare earth, $LaMnO_3$, $LaCrO_3$, $NdGaO_3$, $LaNiO_3$, lanthanum zirconate (LZO), MgO, Pd, Ag, Pt and Au.

The single crystal substrate formed can have a biaxial texture with a full-width-half-maximum of less than equal to 7°, preferably less than 5°, and more preferably less than 3° in all crystallographic directions.

The deformed metal substrate can be a tape. The tape can be at least 1 m long, at least 100 m long or at least 1 km long.

The providing step can include rolling a metal substrate to form the deformed metal substrate. The providing step can include hot or cold wire drawing, hot or cold rolling, and hot or cold forging a metal substrate to form the deformed metal substrate.

A method for forming a biaxially textured substrate includes the steps of providing a deformed metal substrate and than forming an assembly by placing at least one textured seed on the deformed substrate. The seed is selected to avoid secondary recrystallization at temperatures below a predetermined temperature. The assembly is then annealed at a temperature higher than a secondary recrystallization temperature of the metal substrate, but below the predetermined temperature, wherein at least one grain of the metal substrate is nucleated at the seed.

The method can include the step of depositing an electromagnetically active epitaxial layer on the biaxially textured substrate. The electromagnetically active layer can be a superconducting layer, a photovoltaic layer or a ferroelectric layer.

The superconducting layer can comprise an oxide superconductor, such as $REBa_2Cu_3O_7$, where RE is a rare earth element; $Tl_1Ba_2Ca_{n-1}Cu_nO_{2n+3}$, where n is an integer between 1 and 4; $Tl_2Ba_2Ca_{n-1}Cu_nO_{2n+4}$, where n is an integer between 1 and 4; and $Hg_1Ba_2Ca_{n-1}Cu_nO_{2n+2}$, where n is an integer between 1 and 4.

The deformed metal substrate can include Cu, Co, Mo, Cd, Pd, Pt, Ag, Al, and Ni, and alloys thereof. In one embodiment, the deformed metal substrate includes Ni and Ni-based alloys with at least one alloying agent selected from the group consisting of Al, Co, Cr, Cu, Fe, V, Mo, W, and rare earth elements.

The annealing step can include translating the deformed substrate through a heated zone. The heated zone can include a temperature gradient therein. Translation through the heated zone can be discontinuous or continuous.

The method can include the step of depositing at least one epitaxial buffer layer on and in contact with the surface of the biaxially textured metal substrate, and depositing an epitaxial electromagnetically active layer on the buffer layer. The buffer layer can be one or more layers selected from $CeO_2$, YSZ, $Y_2O_3$, $LaAlO_3$, $SrTiO_3$, Nb-doped, $SrTiO_3$, $RE_2O_3$, where RE is a rare earth, $LaMnO_3$, $LaCrO_3$, $NdGaO_3$, $LaNiO_3$, lanthanum zirconate (LZO), MgO, Pd, Ag, Pt and Au.

The biaxially textured substrate formed can have a biaxial texture with a fullwidth-half-maximum of less than equal to 7°, preferably less than 5°, and more preferably less than 3° in all crystallographic directions.

The deformed metal substrate can be a tape. The tape can be at least 1 m long, at least 100 m long or at least 1 km long.

The providing step can include rolling a metal substrate to form the deformed metal substrate. The providing step can include hot or cold wire drawing, hot or cold rolling, and hot or cold forging a metal substrate to form the deformed metal substrate.

The deformed metal substrate and the textured seed can comprise the same or different composition of materials. The secondary recrystallized substrate can be single grained. The secondary recrystallized substrate may have no grain boundaries transverse to the length of the substrate.

A metallic substrate tape includes a sharply biaxially textured metallic substrate, the sharply biaxially textured metallic substrate having a length of at least 0.3 m. The tape can have a biaxial texture with a full-width-half-maximum of less than equal to 7°, preferably less than 5°, and more preferably less than 3° in all crystallographic directions over its entire length. The tape can be single grained. The tape can have no grain boundaries transverse of perpendicular to a length of the tape.

The tape can comprises Cu, Co, Mo, Cd, Pd, Pt, Ag, Al, and Ni, and alloys thereof or a Ni and Ni-based alloy with at least one alloying agent selected from the group consisting of Al, Co, Cr, Cu, Fe, V, Mo, W, and rare earth elements.

An epitaxial tape article includes a sharply biaxially textured metallic substrate tape and at least one epitaxial layer disposed on the tape. The epitaxial layer can include at least one buffer layer. The epitaxial layer can include an electromagnetically active layer which can be disposed on and in contact with the tape. The electromagnetically active layer can be a photovoltaic or ferroelectric material.

The electromagnetically active layer can be a superconducting layer, such as an oxide superconductor. The tape can comprise a Ni or a Ni-alloy single crystal tape and the epitaxial layer comprises an oxide, nitride or carbide layer.

The tape can be a Ni or Ni-alloy single crystal tape and the epitaxial layer can be at least one layer selected from $CeO_2$, $Y_2O_3$, $LaMnO_3$, $RE_2O_3$, where RE is a rare earth, lanthanum zirconate, $SrTiO_3$, Nb-doped, $SrTiO_3$, $LaAlO_3$, $LaCrO_3$, $NdGaO_3$, $LaNiO_3$, YSZ and MgO. In this embodiment, an epitaxial superconductor layer, a photovoltaic layer or a ferroelectric layer can be disposed on the epitaxial layer.

In one embodiment, the epitaxial layer comprises $CeO_2$, and an epitaxial superconductor layer is disposed on the epitaxial layer. In another embodiment, the epitaxial layer can include a layer of YSZ and a layer of $CeO_2$. A superconductor layer can be disposed on the YSZ/$CeO_2$ epitaxial layer.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION OF THE PREFERRED EMBODIMENTS

Figure 1:
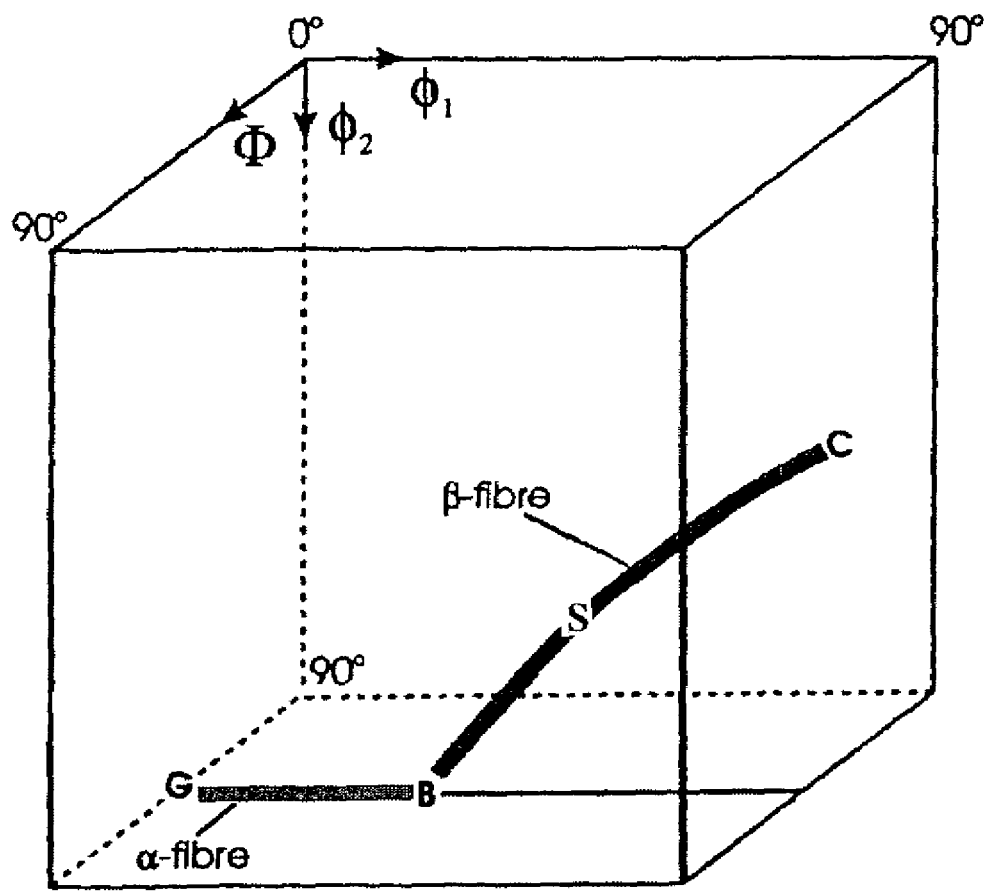
FIG. 1 shows an idealized schematic representation of the rolling texture possibilities in the first subspace of Euler Space.
Figure 2:
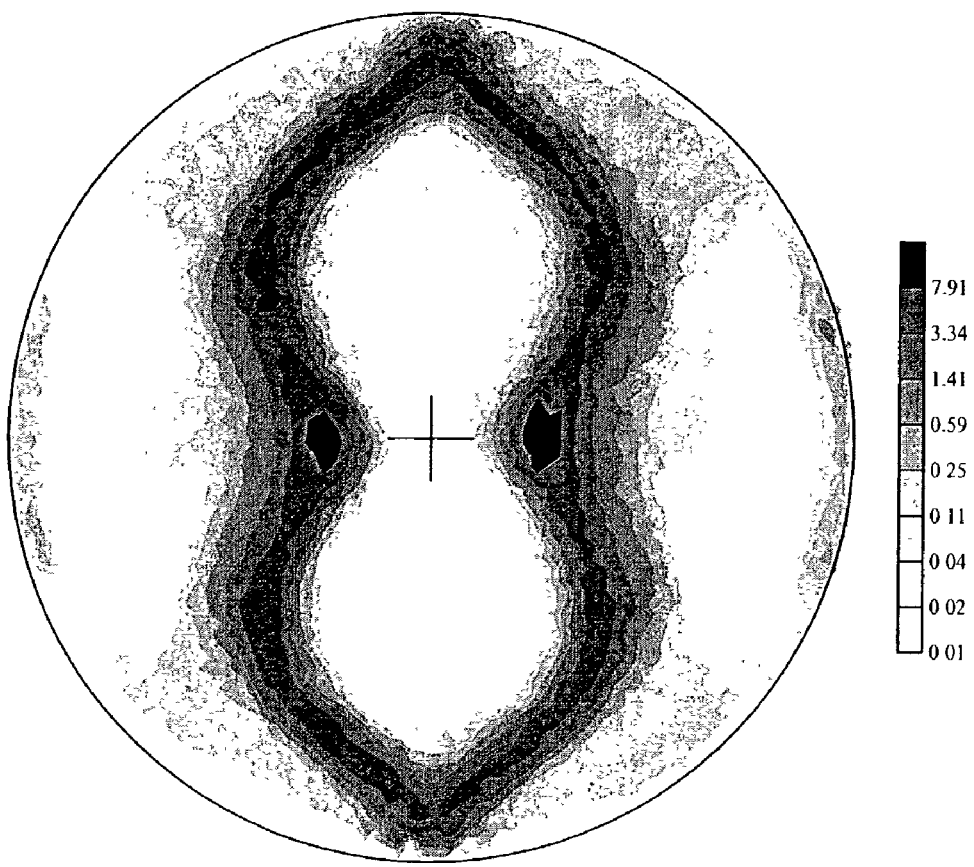
FIG. 2 is a Ni (111) pole figure of an as-rolled material.
Figure 3:
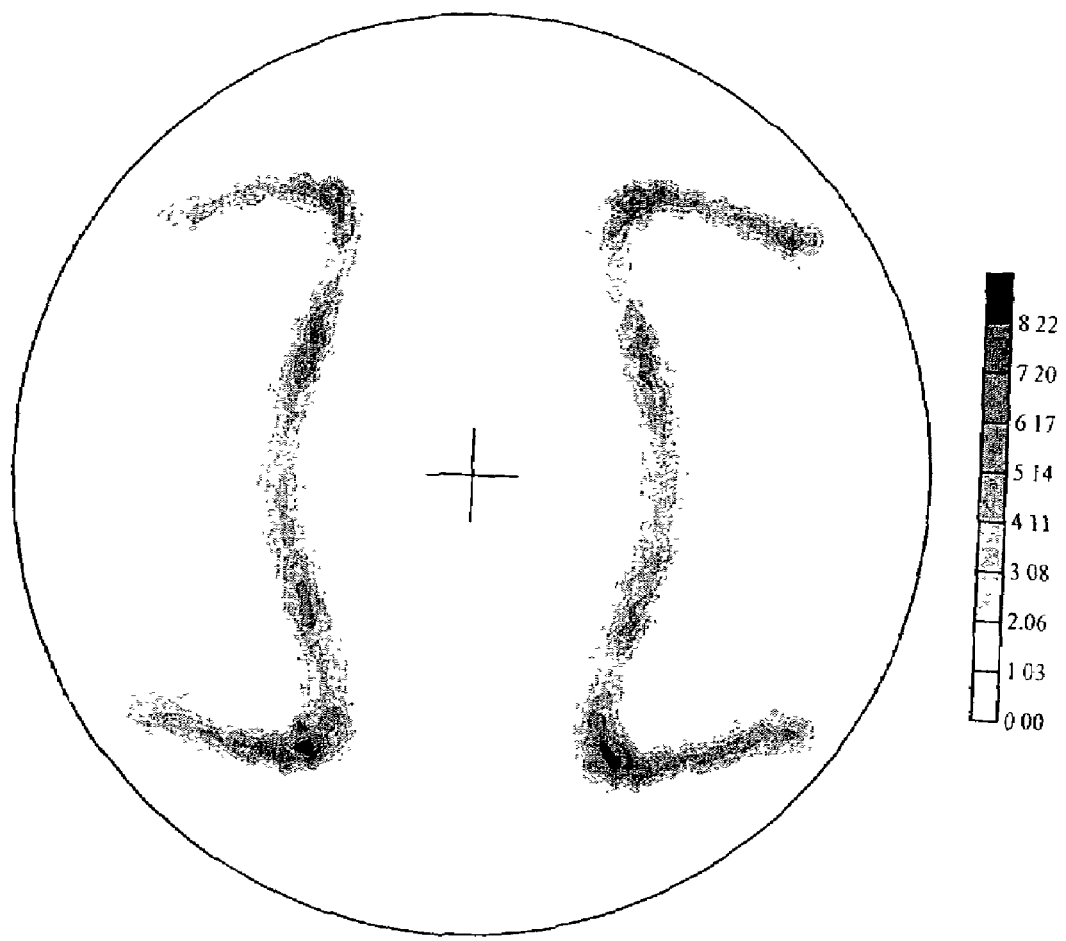
FIG. 3 is a Ni (200) pole figure of an as-rolled material.
Figure 4:
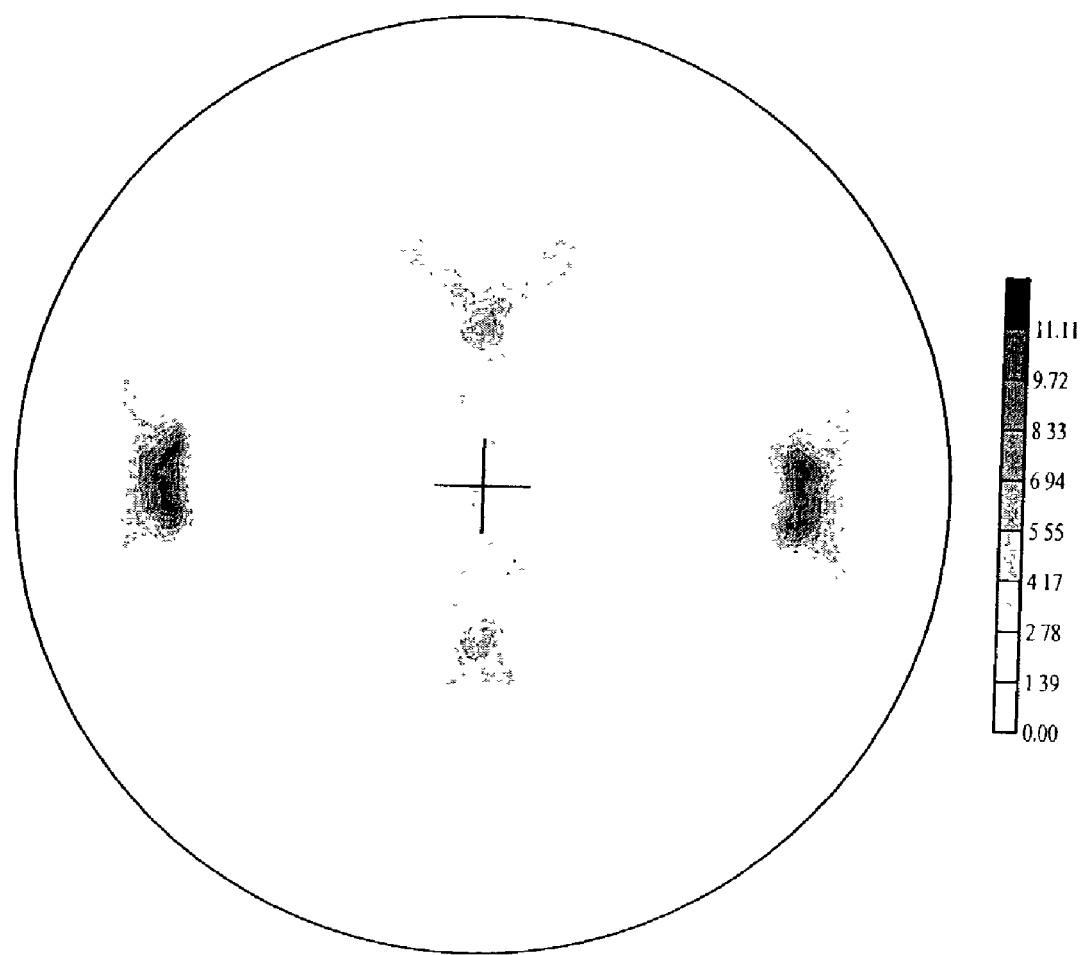
FIG. 4 is a Ni (110) pole figure of an as-rolled material.
Figure 5:
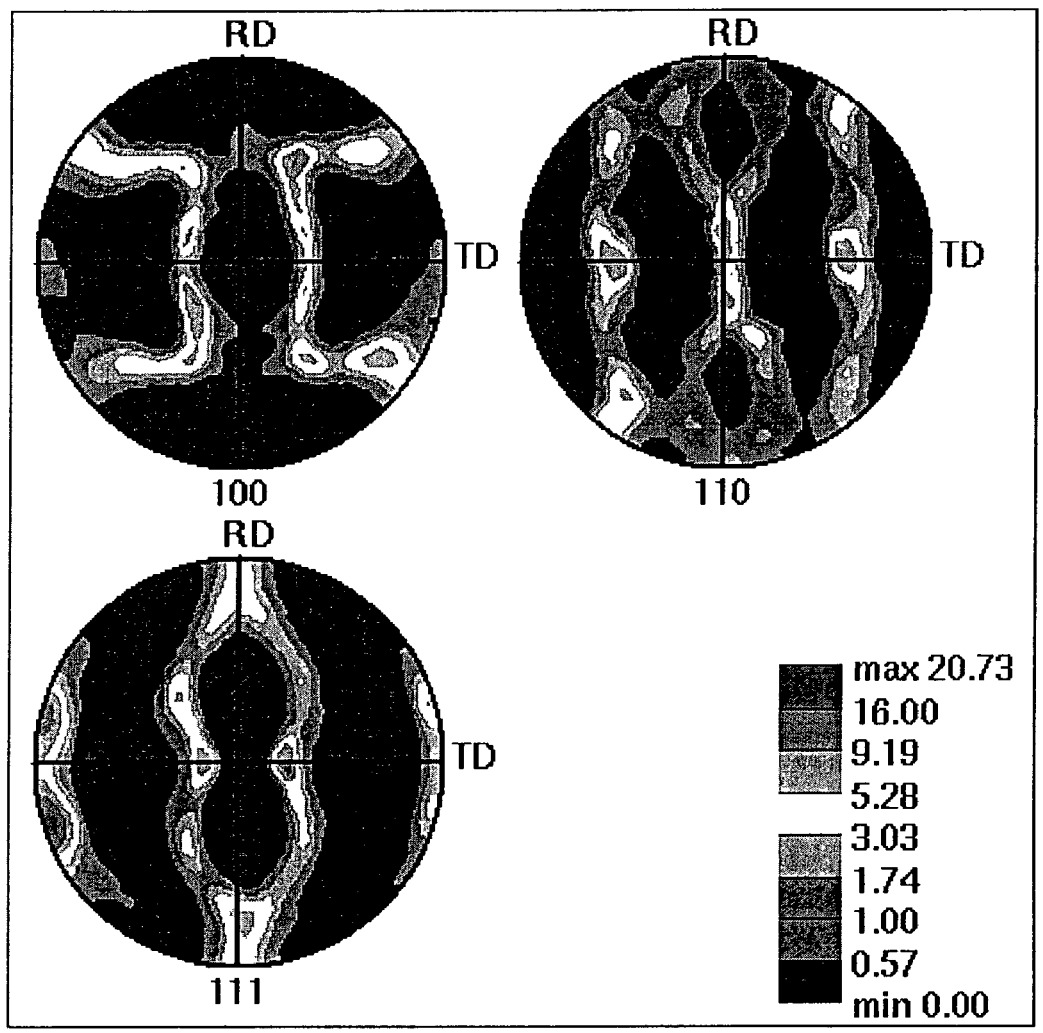
FIG. 5 are (111), (110), (100) pole figures from the surface of an as-rolled Ni tape with a Cu-type rolling texture.
Figure 6:
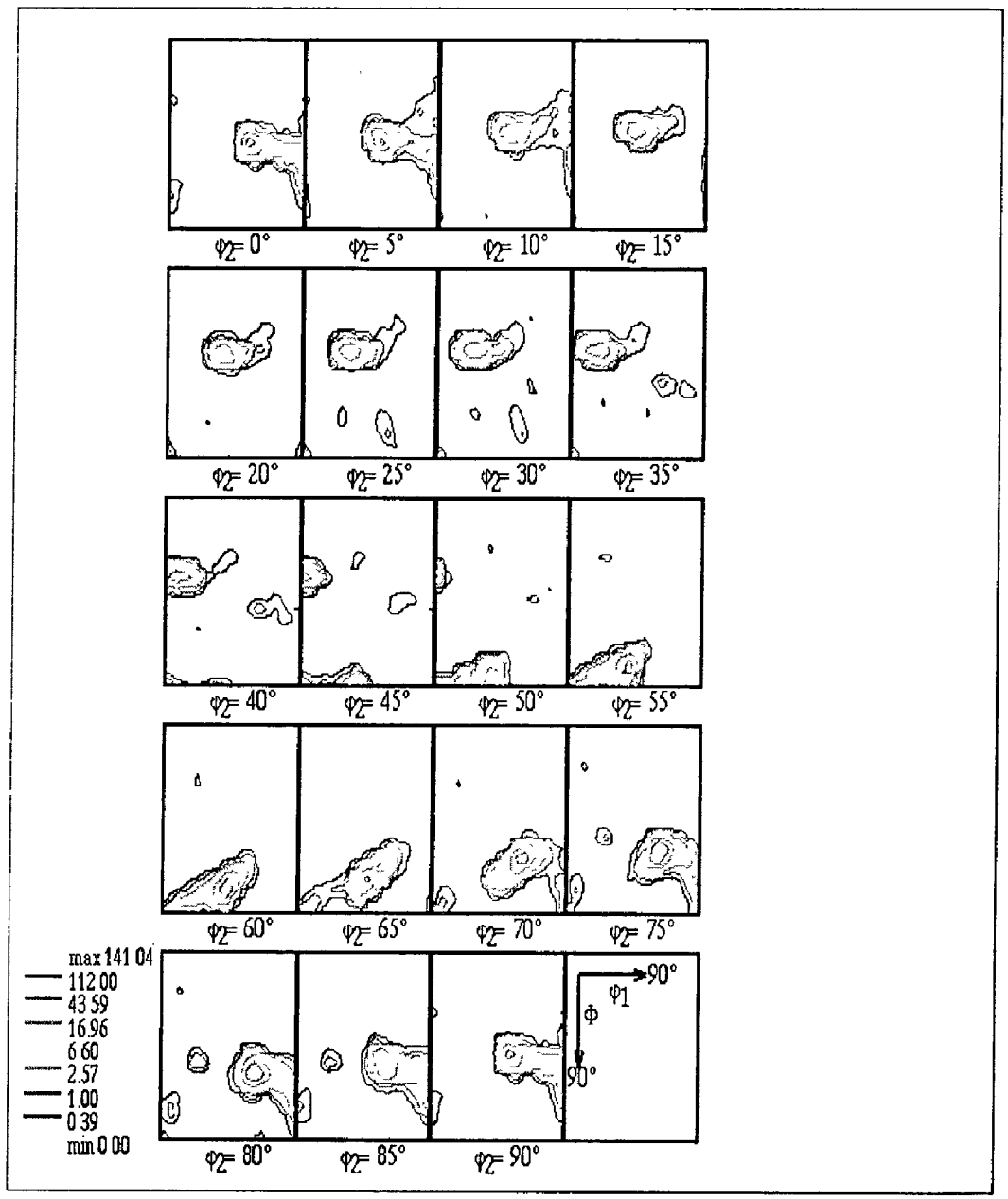
FIG. 6 is a log scale, contour representation of the three dimensional orientation distribution function for the as-rolled Ni sample.

Mechanical deformation of metal substrates to form elongated tapes or sheets followed by annealing cycles has been reported to produce highly biaxially textured substrate tapes or sheets. For example, in the field of superconductors, metallic tapes can be used to form superconducting wires having long (km) lengths, for applications such as for low-loss electrical power lines.

In a preferred embodiment of the invention, a metallic substrate having a sharply biaxially textured texture can be formed by placing at least one textured seed on a heavily deformed substrate with a Cu-type rolling texture to form an assembly. The seed is selected to have the desired substrate orientation, such as a cube oriented seed with an orientation {100}<100>. Upon heating the assembly to a temperature high enough to result in exaggerated grain growth of the deformed substrate but low enough to leave the texture of the seed substantially unchanged, the seed acts as a primary nucleation center for the deformed substrate during its recrystallization. As a result, a sharply biaxially textured metallic substrate is formed.

The resulting substrate formed is stable in its texture even at temperatures beyond its secondary recrystallization temperature, permitting subsequent processing at temperatures higher than otherwise possible without affecting the texture of the substrate. For example, the sharply biaxially textured metallic substrates may withstand subsequent processing at temperatures approaching the melting point of the sharply biaxially textured substrate. Thus, the invention provides significant post-processing flexibility.

Moreover, the ability to heat the assembly to a temperature above the primary recrystallization temperature produces larger substrate grains, and accordingly, results in the formation of fewer substrate grain boundaries by the seeded secondary recrystallization method. Fewer substrate grain boundaries permit formation of improved epitaxial articles. For example, applied to superconducting articles, fewer grain boundaries in the substrate results in fewer grain boundaries in the epitaxial superconducting layer disposed on the substrate, reducing the additive degradation effects on supercurrent and providing a higher Jc for the superconductor.

In the case of a cube oriented seed, the substrate formed has a crystallographic plane parallel to the substrate surface upon which at least one epitaxial buffer layer and then a superconducting layer can be grown directly thereon. The superconducting layer can have a single epitaxial orientation which permits fabrication of polycrystalline HTS conductors with reduced grain boundary effects on current transmission. Accordingly, the invention has utility in the electric power industry.

When a metal or metal alloy is heavily deformed, an additional recrystallization process, referred to as a secondary recrystallization process will commence above a secondary recrystallization temperature. As defined herein, the phrase "heavily deformed" generally represents a deformation percentage of at least 60%, the required deformation percentage being a function of the particular material deformed. Deformation percentage (DP) can be defined by the following relation:

$$DP=(I-F)/(I)\times 100\%$$

where I is the thickness prior to deformation, F is the thickness following deformation. For example, if I=1000 μm (1 mm) and F=10 μm, the deformation percentage (DP) is 99%.

A suitable starting material is a crystalline metallic material that is heavily deformed and has at least two recrystallization temperatures, a primary and secondary recrystallization temperature. An annealing texture may develop when the material is heated above its primary recrystallization temperature, thereby resulting in primary recrystallization. However, if the material is heated to a temperature above the primary recrystallization temperature, grain growth can occur in an uncontrolled manner and a few grains may grow very large while the rest of the grains remain approximately unchanged until consumed by the few large grains. The latter type of grain growth, referred herein as "secondary recrystallization" has been previously considered to be undesirable for most applications, such as for superconducting devices due to the formation of randomly orientated grains which generally result in the formation of high-angle grain boundaries.

For example, when a face-centered cubic (FCC) metal or alloy is first heavily mechanically deformed and then annealed at a temperature above its primary recrystallization temperature but below its secondary recrystallization temperature, the formation of a sharp {100}<100> cube texture is known to result. However, if the deformed substrate is annealed at a temperature above its secondary recrystallization temperature (SRT), off-cube crystal orientations appear. Off-cube orientations are generally undesirable because newly formed secondary recrystallized grains have arbitrary orientations and typically have a high angle relative to the [100] axis of the substrate surface. In other words, the plane parallel to the surface is not a low index (100) or (110) plane. Moreover, high angle grain boundary regions generally result whenever two secondary recrystallized grains impinge.

The above-mentioned deleterious effects are avoided using the invention by controlling the secondary recrystallization process. One way this can be accomplished is via seeding of the heavily deformed metal tape with a seed of the desired orientation. For example, in order to obtain a cube textured, secondary recrystallized sheet, a heavily deformed metal tape may be used as a starting material. A small seed can be placed on top of the tape such that the seed already has a cube texture and that it does not undergo secondary recrystallization (SR) at the highest annealing temperature used.

The metal substrate with the seed is then heated to a temperature higher than the secondary recrystallization temperature (SRT) of the metal tape. Upon such a heating step, only SR of the metal tape occurs. New substrate grains formed are nucleated from the seed. As a result, the SR grains receive the orientation provided by the seed, such as a {100}<100>, cube orientation. Cube orientations include face-centered cubic or body-centered cubic. Other structures may include hexagonal close packed materials.

The seed can be formed from the same material as the substrate, such as a Ni seed and a Ni substrate. However, seeds can be selected from any suitable material, provided the seed has the desired orientation and is chemically and structurally compatibility with the substrate material.

The invention can be used to fabricate a sharply biaxially textured substrate tape of a desired length by pulling a seeded substrate tape through a heated zone. A heated zone may be provided by a furnace. A reel-to-reel or similar apparatus may be used for translation of the seeded substrate. The speed of pulling the tape through a heated zone should produce good results over a broad range of pull speeds, the appropriate pull speed determinable by routine experimentation. The atmosphere in which the metal tape is annealed is also important and can affect the secondary recrystallization temperature by modification of surface energies. For example, annealing in commonly used gases such as Ar, $N_2$, $H_2$, $NH_3$, $H_2S$ water vapor, as well as mixtures of these gases, can affect the SR temperature differently. The appropriate gas to be used for each metal/alloy can be determined by routine experimentation.

Although a single seed can generally be used to form a sharply biaxially textured tape, improved results may be provided by using more than one seed. For example, one seed may be placed every 10 m in the formation of a 1 km long tape. All seeds placed along the length or width of the substrate should be crystallographically aligned with respect to one another if the goal is to form a wide and long single crystal.

Although not essential, a temperature gradient in the heated zone (e.g. furnace) is preferred since it can be used to better control crystal growth during recrystallization. A temperature gradient can reduce or avoid undesirable random orientation secondary recrystallization which can occur away from the growing seed front. Even a small temperature gradient should be sufficient (e.g. 50°/cm). The preferred minimum temperature gradient can be determined by routine experimentation.

Alternatively, a heavily deformed substrate with a Cu-type texture can be heated in a thermal gradient without the presence of a seed. The directional annealing of the tape above its secondary recrystallization temperature alone can provide sufficient control of the secondary recrystallization process. As noted before, the temperature of annealing, the length of the zone, the speed of translation of the tape through the gradient, the atmosphere or gas during annealing, can all be determined by routine experimentation.

Long single crystal substrates can be obtained wherein a single SR grain grows to engulf the entire substrate. For example, the invention can be used to fabricate a sharply biaxially textured substrate tape of a desired length by pulling the heavily deformed metal substrate tape with a Cu-type texture through a heated zone. A heated zone may be provided by a furnace using resistive heating of tape or by using electron beams, laser beams, induction or infrared heating. A reel-to-reel or similar apparatus may be used for translation of the seeded substrate. The speed of pulling the tape through a heated zone can produce good results over a broad range of pull speeds, the appropriate pull speed and thermal gradient determinable by through routine experimentation.

The resulting single crystal substrates can then be coated and/or reacted by a variety of techniques to produce chemically and structurally compatible, textured barrier layers and/or alloys to form a variety of devices. An epitaxial layer of another material can then be grown on the sharply biaxially textured metallic substrate, or on a barrier layer, using any of a variety of known techniques. The texture from the sharply biaxially textured metallic substrate or the barrier layer is then induced in the epitaxial layer. It is thereby possible to deposit biaxially aligned devices having sharp biaxial textures.

The metal substrate formed may be used to form a variety of devices having electronically active layers disposed on the substrate. The electronically active layer may be a superconductor, a semiconductor, a photovoltaic, a ferroelectric or an opto-electric, or any other electromagnetic device wherein grain boundary control is important.

Figure 7:
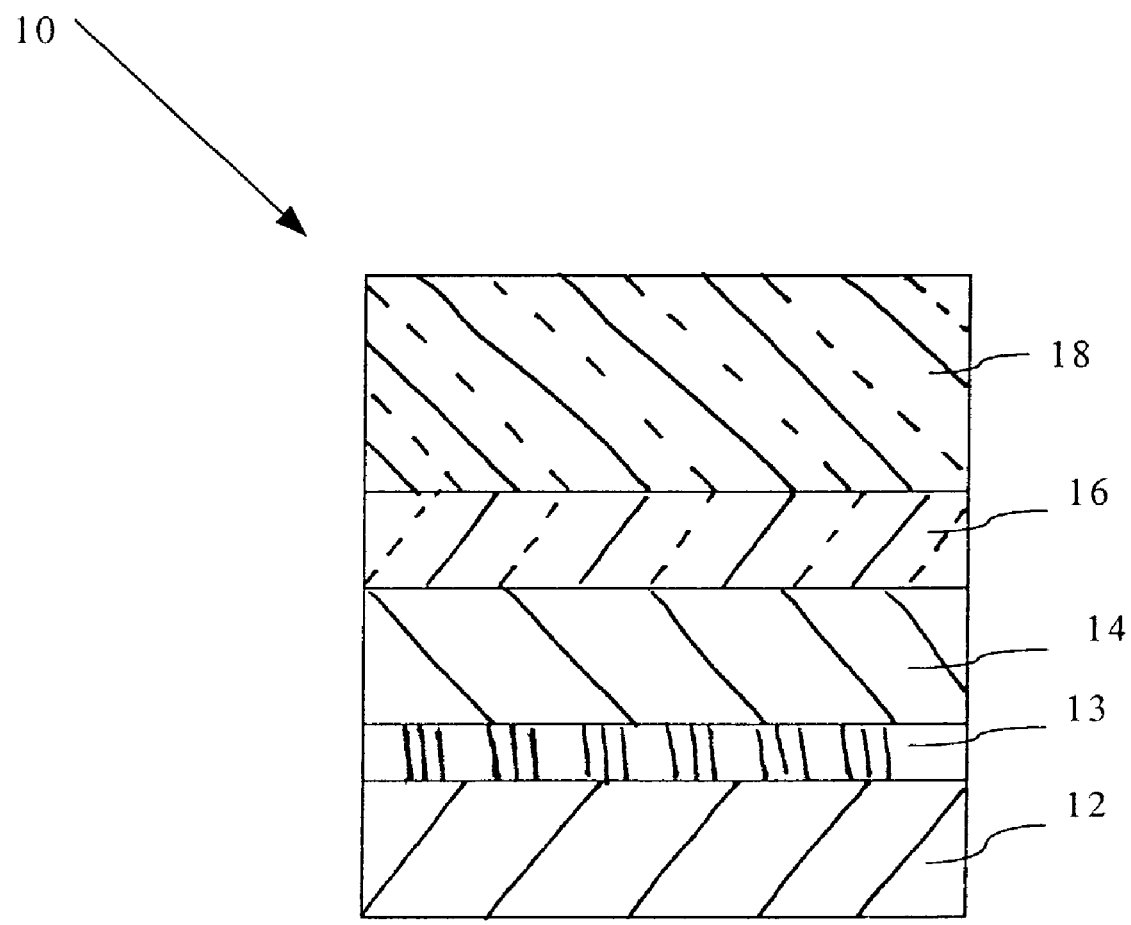
FIG. 7 is a cross-sectional view of a superconductor article formed with a biaxially textured substrate.

For example, a biaxially-textured superconductor article for power transmission lines generally has a multi-layer composition 10, as shown in FIG. 7. According to the invention, a superconductor article consists of a sharply biaxially textured metallic substrate 12. At least one epitaxial buffer layer, such as buffer layers 14 and 16, can be disposed on the sharply biaxially textured metallic substrate 12. A superconducting layer 18 can be disposed on buffer layer 16.

Although shown having buffer layers 13, 14 and 16, multi-layer composition 10 can be formed by disposing superconducting layer 18 directly on and in contact with the sharply biaxially textured metallic substrate 12, provided the respective layers are both chemically and structurally compatible. For example, oxide superconductors may be disposed directly on and in contact with a sharply biaxially textured Ag (or Ag alloy) substrate 12. The sharply biaxially textured metallic substrate 12 provides mechanical support for the superconductor article, and can be fabricated over long lengths and large areas. Alternatively, one, two or three or more buffer layers can be used.

The substrate 12 can be any alloy or metal having a deformed surface. A deformed metal surface is generally formed by rolling a metal material. The deformed metal substrate can include Cu, Co, Mo, Cd, Pd, Pt, Ag, Al, and Ni, and alloys thereof. In one embodiment, the deformed metal substrate includes Ni and Ni-based alloys with at least one alloying agent selected from the group consisting of Al, Co, Cr, Cu, Fe, V, Mo, W, and rare earth elements.

Optional epitaxial metal oxide, nitride, carbide or boride buffer layers 14 and 16 may comprise the next layer in the superconductor article. The buffer layers 14 and 16 can be formed from suitable materials, such as one or more layers selected from $CeO_2$, YSZ, $Y_2O_3$, $LaAlO_3$, $LaCrO_3$, $NdGaO_3$, $LaNiO_3$, $SrTiO_3$, Nb-doped $SrTiO_3$, $RE_2O_3$, where RE is a rare earth, $LaMnO_3$, lanthanum zirconate (LZO), MgO, $NdGaO_3$, $NbTiO_3$, TiN, TZN, $TiB_2$, Pd, Ag, Pt and Au, which can serve as chemical barriers between the substrate surface 12 and superconducting layer 18. A buffer layer may preferably be a substantially electrically conductive layer, which can provide an electrical shunt between superconducting layer 18 and substrate 12.

Buffer layers can be deposited by techniques such as physical or chemical vapor deposition, sol-gel and electrodeposition. Deposition is followed by annealing to form epitaxial, biaxially textured layers on the textured substrate (metal/alloy). The superconducting layer 18 can then be deposited on buffer layer 16. Alternatively, superconductor layer 18 can be disposed directly on and in contact with substrate 12.

The superconductor layer 18 is preferably an oxide superconductor. For example, the oxide superconductor can be selected from oxide superconductors, such as $REBa_2Cu_3O_7$ where RE is a rare earth element, $Tl_1Ba_2Ca_{n-1}Cu_nO_{2n+3}$; where n is an integer between 1 and 4; $Tl_2Ba_2Ca_{n-1}Cu_nO_{2n+4}$ where n is an integer between 1 and 4; and $Hg_1Ba_2Ca_{n-1}Cu_nO_{2n+2}$, where n is an integer between 1 and 4.

The ability to form a sharply biaxially textured substrate 12 permits subsequent epitaxially grown layers to have correspondingly improved crystalline qualities. In particular, superconducting layer 18 having a high level of biaxial grain alignment results in a high percentage of low angle superconducting grain boundaries. The ability to form superconducting grains having a high percentage of low angle grain boundaries is known to result in significant improvement in the superconducting properties of various superconducting films.

The superconductor, or other electromagnetically active layer, may be deposited by a variety of techniques, such as vapor deposition, laser ablation, sputtering, sol-gel, dip coating, electrodeposition, electrophoretic deposition, spray pyrolysis and doctor blade techniques. In some of the techniques, such as laser deposition, the as-deposited superconductor layer may be textured, but in other cases an additional oxygen anneal at appropriate oxygen partial pressures will be required to induce the texture from the substrate into the superconductor. The method also applies to solution precursor deposits to which one or more cations must be added from the vapor during the reaction to form the superconducting phase.

EXAMPLE 1

Ni was heavily deformed at about 10% reduction per pass starting from a thick slab of 1" to 125 microns thick tape. The tape was rolled by reverse rolling in each pass. X-ray diffraction of the as-deformed tape indicated the formation of an ideal Cu-type texture [11].

For such a deformed tape, it is well established that much of the intensity lies along the β-fiber. This material starts to undergo primary recrystallization at about 400° C. It further undergoes secondary recrystallization at temperature greater than 1200° C. Sample of as-deformed Ni were placed in a furnace at room temperature in flowing 4% $H_2$-96%-Ar. The furnace was quickly heated to 1300° C. and the sample held for one hour at that temperature. The sample was then furnace cooled to room temperature.

Figure 8A:
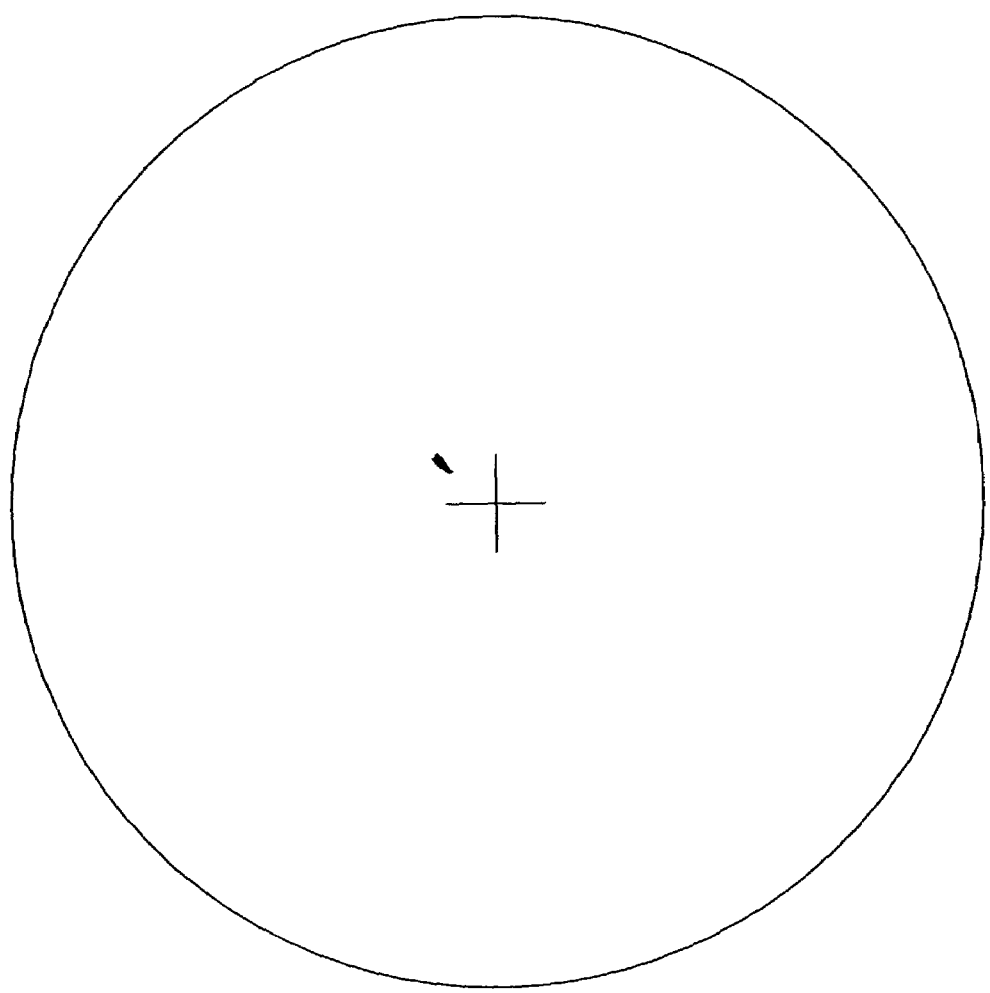
FIG. 8(a) illustrates the (200) x-ray pole figure for a Ni single crystal fabricated by secondary recrystallization.
Figure 8B:
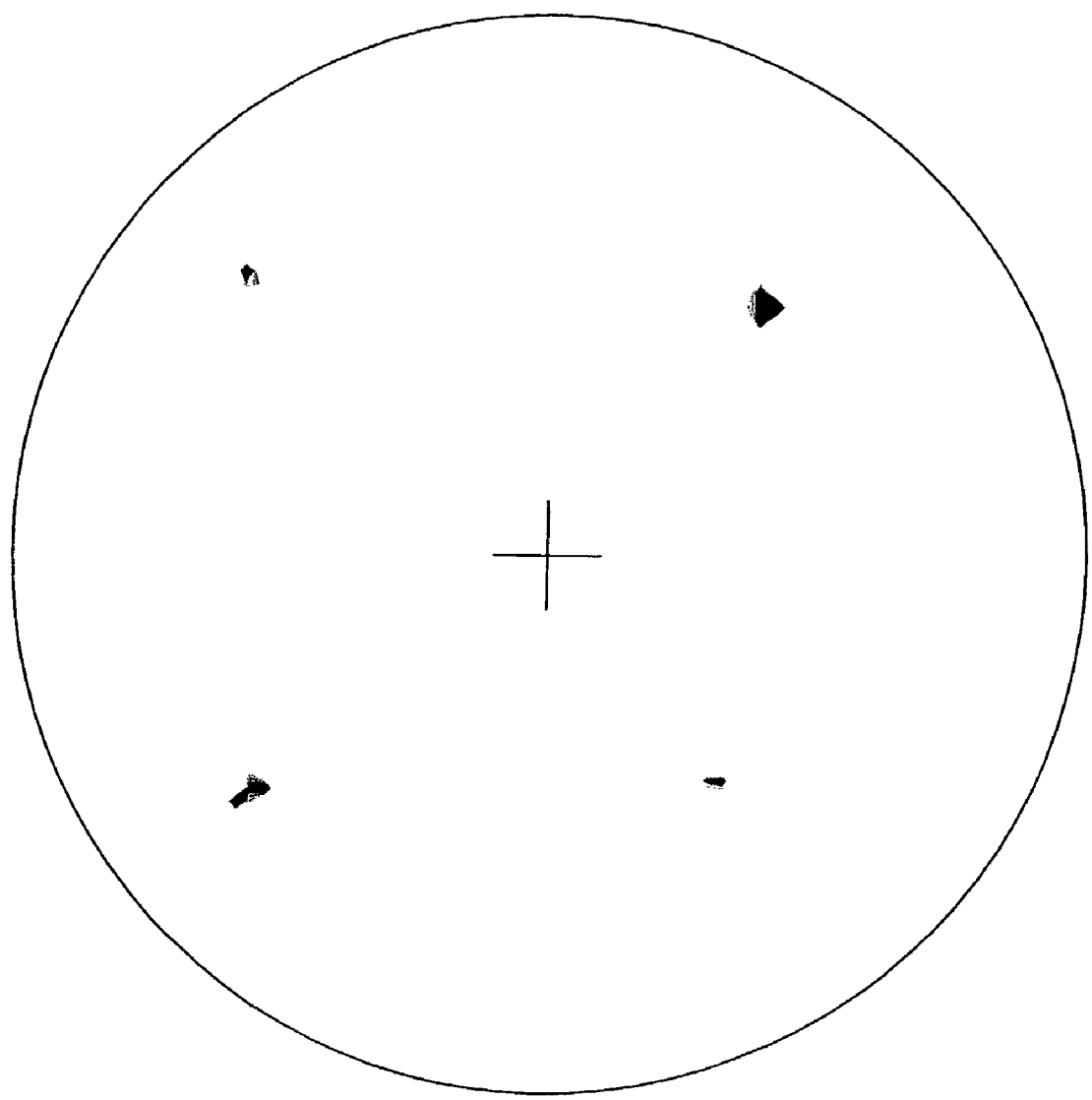
FIG. 8(b) illustrates the (111) x-ray pole figure for a Ni single crystal fabricated by secondary recrystallization.

FIGS. 8(a) and 8(b) show (200) and (111) pole figure of Ni single crystal substrate fabricated by secondary recrystallization, respectively. It can be seen that [002] axis of the Ni tape is rotated with respect to two Euler angles compared to a perfectly cube oriented with a 0 degree angle of the [002] to the surface normal to the tape. The FWHM of the out-of-plane texture as measured by a rocking curve or an omega-scan was found to be 2°. The FWHM of the in-plane texture as measured by a phi-scan was found to be 3°. The surface of the crystal was adequately sulfurized to form a c(2×2) sulfur superstructure [13]. An epitaxial $CeO_2$ seed layer was then deposited on the substrate by electron beam evaporation. $CeO_2$ was deposited using a cerium metal source at a substrate temperature of 650° C. Oxidation of the Ni surface during the heat-up phase was prevented by the introduction of a reducing forming gas comprising 96% Ar and 4% $H_2$. Cerium oxide was formed by the in-situ reaction of the cerium with water vapor ($1\times10^{-5}$ Torr) supplied to the vacuum system during deposition. A YSZ (300 nm) and $CeO_2$ (20 nm) layer were then deposited using RF sputtering while the substrate was maintained at 780° C. in $1\times10^{-2}$ Torr of forming gas and $2\times10^{-6}$ Torr of water vapor. YBCO was then deposited using the ex-situ $BaF_2$ process [12].

Figure 9A:
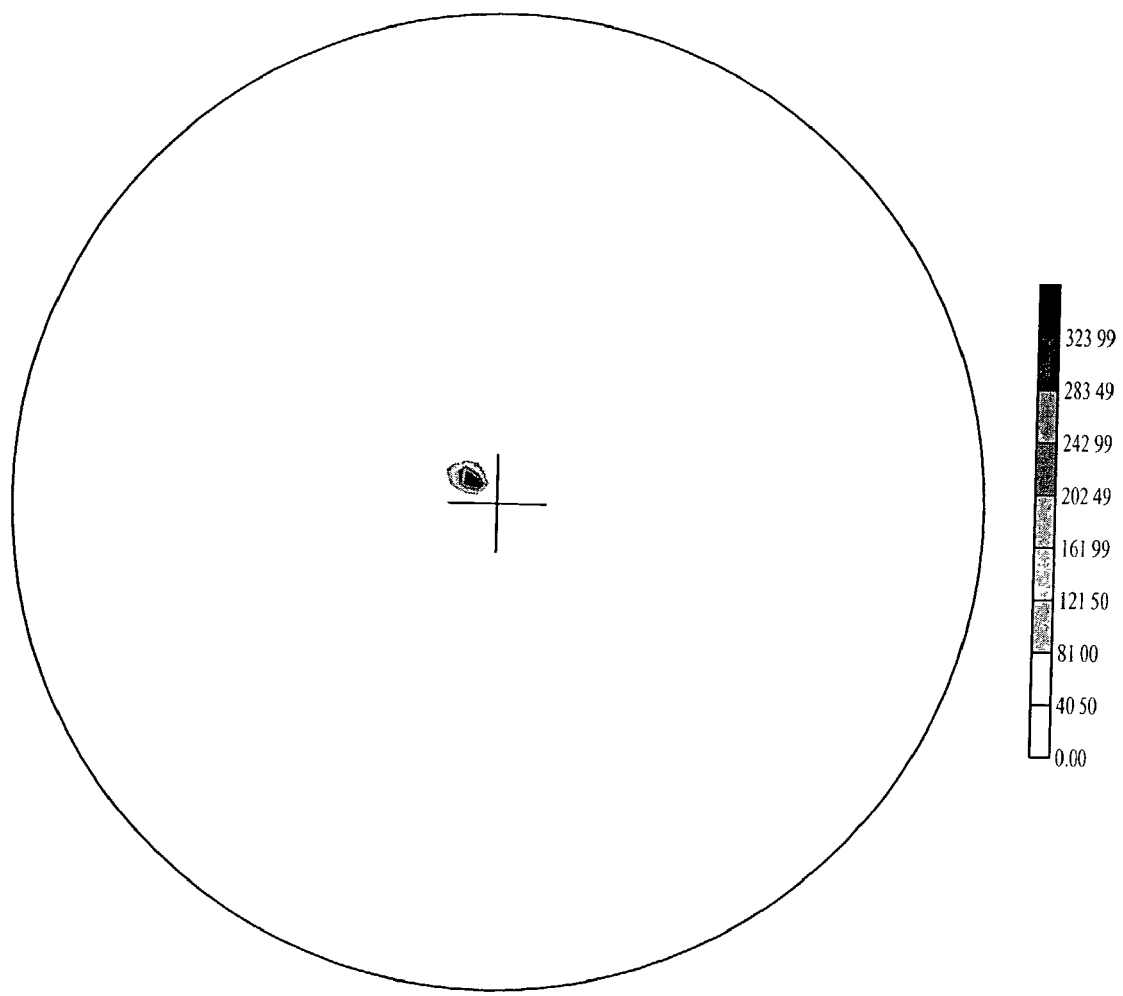
FIG. 9(a) illustrates the (200) x-ray pole figure for a YSZ layer deposited epitaxially on a Ni single crystal substrate.
Figure 9B:
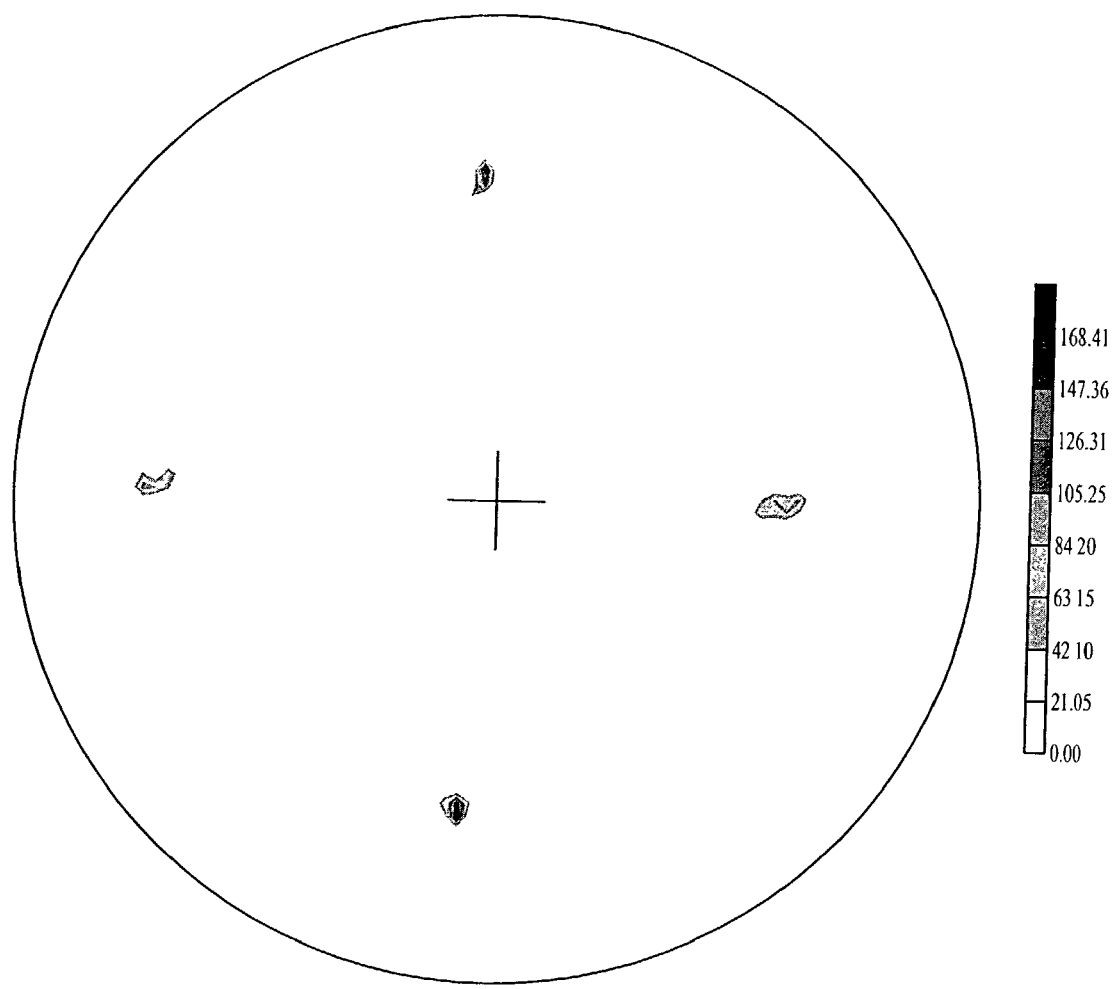
FIG. 9(b) illustrates the (111) x-ray pole figure for a YSZ layer deposited epitaxially on a Ni single crystal substrate.
Figure 10A:
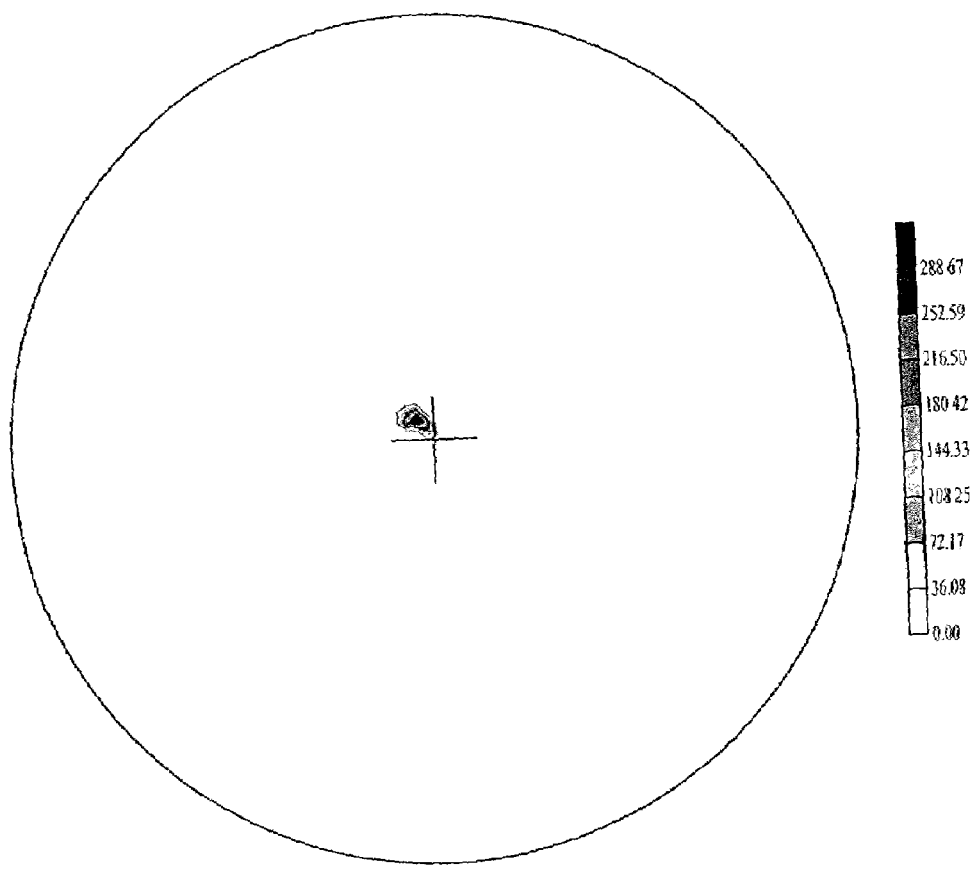
FIG. 10(a) illustrates the (006) x-ray pole figure for an epitaxial YBCO layer formed on top of epitaxial oxide buffer layers, the oxide buffer layers deposited epitaxially on a Ni single crystal substrate.

FIGS. 9(a) and (b) show (200) and (111) pole figure of the YSZ layer deposited epitaxially on the Ni single crystal substrate, respectively. It can be seen that the tilt of the [002] is somewhat reduced in this case. FIGS. 10(a) and (b) show (006) and (113) pole figures, respectively, for the YBCO layer deposited epitaxially the $CeO_2$/YSZ/$CeO_2$ buffer stack, the buffer stack disposed on a Ni single crystal substrate.

Figure 10B:
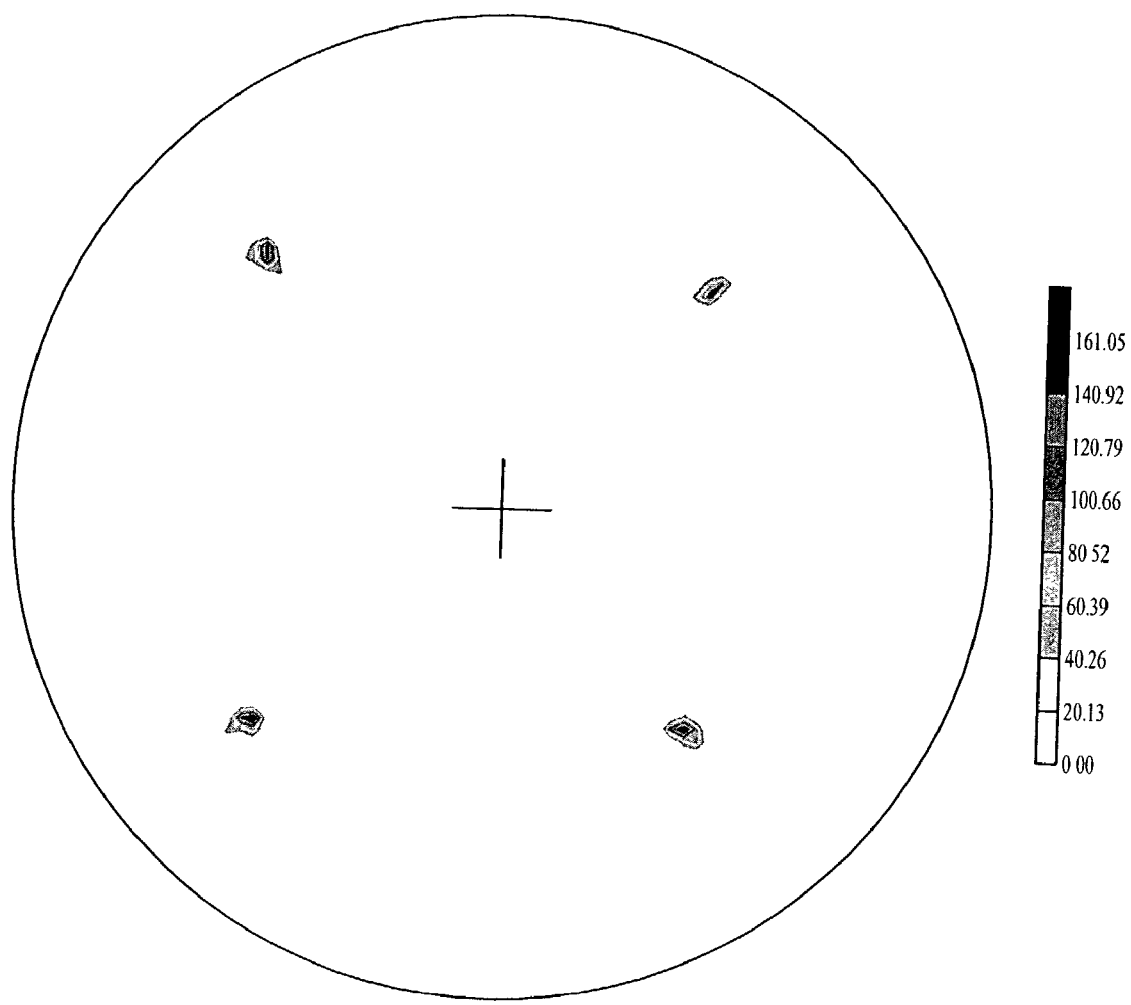
FIG. 10(b) illustrates the (113) x-ray pole figure for an epitaxial YBCO layer formed on top of epitaxial oxide buffer layers, the buffer layers deposited epitaxially on a Ni single crystal substrate.

The YBCO (006) Pole Figure shown in FIG. 10(a) evidences that the [002] tilt with respect to two Euler angles from the normal to the tape has reduced even more. However, the YBCO normal is slightly tilted with respect to the tape normal. Thus, it can be seen that the tilt of the [006] YBCO reflection is now significantly reduced from that of the Ni tape substrate. Similarly, the YBCO (113) pole figure shown in FIG. 10(b) evidences that the [002] tilt with respect to two Euler angles from the normal to the tape has reduced even more. However, the YBCO normal is still slightly tilted with respect to the tape normal. Hence, even these tilted Ni substrates should be very useful for many applications.

A four point probe was used to measure the critical current density of the sample. The Jc was found to be 3.9 MA/cm² at 77 K and self-field. The Jc is higher than any value reported to date on any metal/alloy substrate.

EXAMPLE 2

A Ni—Cr alloy with 13 at % Cr was cold rolled to form a well developed Cu-type rolling texture. The sample was found to have a secondary recrystallization temperature of 1050° C. The Ni—Cr sample was annealed in 4% $H_2$-96% Ar for one hour at 1300° C. The sample was then furnace cooled. It was found that the substrate was essentially a single crystal with a texture similar to that shown in FIGS. 8(a) and (b). The surface of the crystal was adequately sulfurized to form a c(2×2) sulfur superstructure [13]. Epitaxial oxide buffer layers and a superconductor layer were deposited on the substrate according to conditions shown in Example 1 to yield a high-Jc material. Deposition of an epitaxial Ni buffer layer before the deposition of any other oxide buffer layer was found to be easier to work with.

EXAMPLE 3

A Ni—W alloy with 5 at % W was cold rolled to form a well developed Cu-type rolling texture. The sample was found to have a secondary recrystallization temperature of 1050° C. The Ni—W sample was annealed in 4% $H_2$-96% Ar for one hour at 1300° C. The sample was then furnace cooled. It was found that the substrate was essentially a single crystal with a texture similar to that shown in FIGS. 8(a) and (b). The surface of the crystal was adequately sulfurized to form a c(2×2) sulfur superstructure [13]. Epitaxial oxide buffer layers and a superconductor layer were deposited on the substrate according to conditions shown in Example 1 to yield a high-Jc material. Deposition of an epitaxial Ni buffer layer before the deposition of any other oxide buffer layer was found to be easier to work with.

EXAMPLE 4

A deformed Ni tape having a well-formed Cu-type texture was inserted into a reel-to-reel system with a tube furnace at the center. The tape had a SRT of 1200° C. The furnace was heated to a temperature of 1300° C. and the tape was traversed through the furnace within an alumina tube with flowing 4% $H_2$-96% Ar gas. X-ray examination of a one meter tape fabricated in this continuous annealing manner indicated the tape to be essentially one long single crystal. The surface of the crystal was adequately sulfurized to form a c(2×2) sulfur superstructure [13].

Epitaxial oxide buffer layers and a superconductor layer were deposited on the substrate according to conditions shown in Example 1 to yield a high-Jc material. Deposition of an epitaxial Ni buffer layer before the deposition of any other oxide buffer layer was found to be easier to work with.

EXAMPLE 5

Ni was heavily deformed at 10% reduction per pass starting from a thick slab of 1" to 125 microns thick tape. The tape was rolled by reverse rolling in each pass. X-ray diffraction of the as-deformed tape indicated the formation of an ideal Cu-type texture [11]. For such a deformed tape, it is well established that much of the intensity lies along the β-fiber. This material starts to undergo primary recrystallization at about 400° C. It further undergoes secondary recrystallization at temperature greater than 1200° C. Samples of as-deformed Ni were placed in a furnace at room temperature in flowing 4% $H_2$-96%-Ar. The furnace was quickly heated to 1300° C. and the sample held for one hour. The sample was then furnace cooled to room temperature. It was found that the substrate was essentially a single crystal with a texture similar to that shown in FIGS. 8(*a*) and (*b*). The sample was then thermally oxidized to form an epitaxial coating of NiO. Further epitaxial oxide buffer layers and a superconductor layer were deposited on the substrate according to conditions shown in Example 1 to yield a high-Jc material.

EXAMPLE 6

Ni was heavily deformed at 10% reduction per pass starting from a thick slab of 1" to 125 microns thick tape. The tape was rolled by reverse rolling in each pass. X-ray diffraction of the as-deformed tape indicated the formation of an ideal Cu-type texture [11]. For such a deformed tape, it is well established that much of the intensity lies along the β-fiber. This material starts to undergo primary recrystallization at about 400° C. It further undergoes secondary recrystallization at temperature greater than 1200° C. Samples of as-deformed Ni were placed in a furnace at room temperature in flowing 4% $H_2$-96%-Ar. The furnace was quickly heated to 1300° C. and the sample held for one hour. The sample was then furnace cooled to room temperature. It was found that the substrate was essentially a single crystal with a texture similar to that shown in FIGS. 8(*a*) and (*b*). Epitaxial YZN was then deposited on the single crystal tape by reactive vapor deposition such as sputtering. The epitaxial nitride layer was then converted to an epitaxial oxide layer by subsequent oxidation.

EXAMPLE 7

Ni-13 at. % Cr was heavily deformed at 10% reduction per pass starting from a thick slab of 1" to 125 microns thick tape. The tape was rolled by reverse rolling in each pass. X-ray diffraction of the as-deformed tape indicated the formation of an ideal Cu-type texture [11]. For such a deformed tape, it is well established that much of the intensity lies along the β-fiber. This material starts to undergo primary recrystallization at about 400° C. It further undergoes secondary recrystallization at temperature greater than 1050° C. Samples of as-deformed Ni were placed in a furnace at room temperature in flowing 4% $H_2$-96%-Ar. The furnace was quickly heated to 1300° C. and the sample held for one hour. The sample was then furnace cooled to room temperature. It was found that the substrate was essentially a single crystal with a texture similar to that shown in FIGS. 8(*a*) and (*b*). The sample was then thermally oxidized to form an epitaxial coating of NiO. Further epitaxial oxide buffer layers and a superconductor layer were deposited on the substrate according to conditions shown in Example 1 to yield a high-Jc material. Deposition of an epitaxial Ni buffer layer before the deposition of any other oxide buffer layer was found to be easier to work with.

EXAMPLE 8

Two samples of heavily deformed Ni measuring 1 inch×1 inch and 125 microns thick were obtained by cold rolling. Nickel is known to form a strongly cubic texture by annealing after significant deformation, such as 90% mechanical deformation, at 900° C. for 2 hours. However, upon annealing at temperatures of approximately 1100° C., or more, it undergoes SR. On one piece of the substrate, a 50 m section of non-deformed cube textured Ni which does not undergo SR at 1100° C. was placed thereon. The entire assembly was placed in a tube furnace in low oxygen partial pressure and heated at 1100° C. for 10 hrs. Both the sample with and without the seed were annealed in the same heating process.

Figure 11:
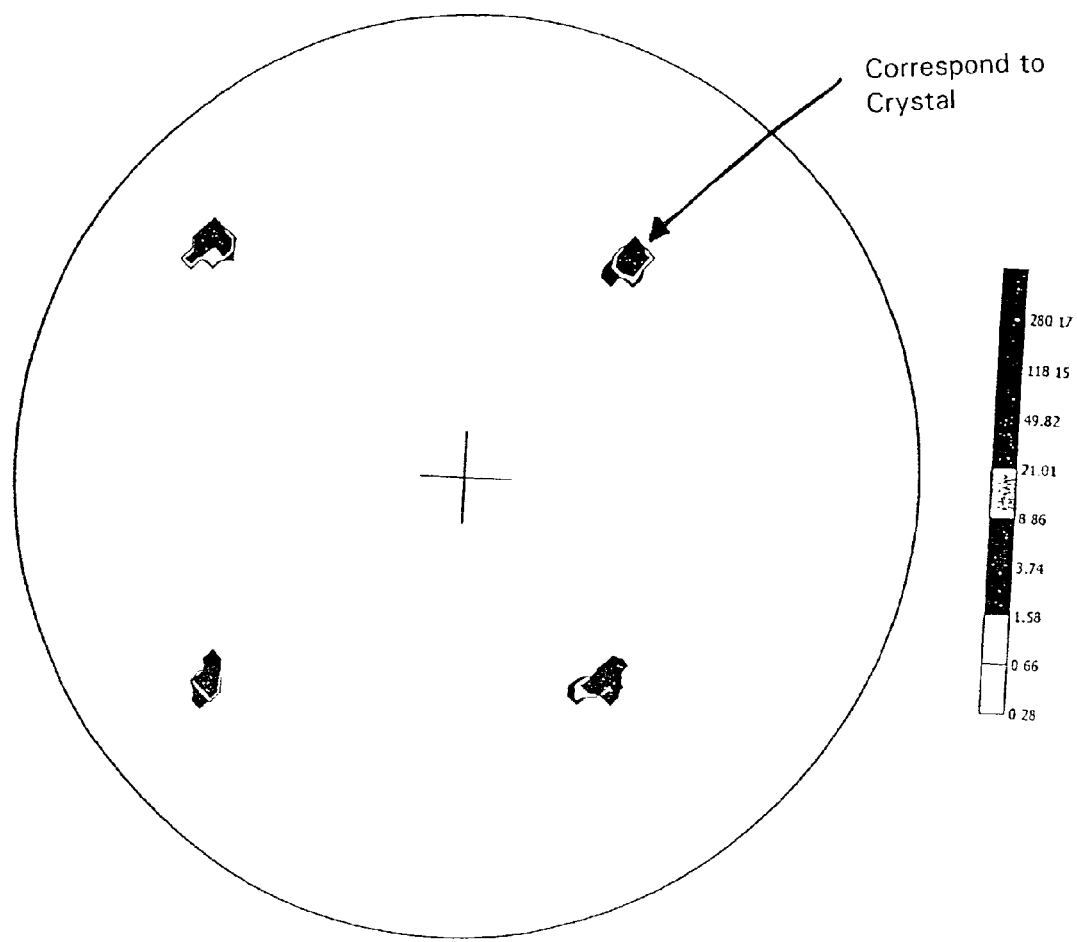
FIG. 11 illustrates the (111) X-ray pole figure for the back side of a seeded tape after annealing.
Figure 12:
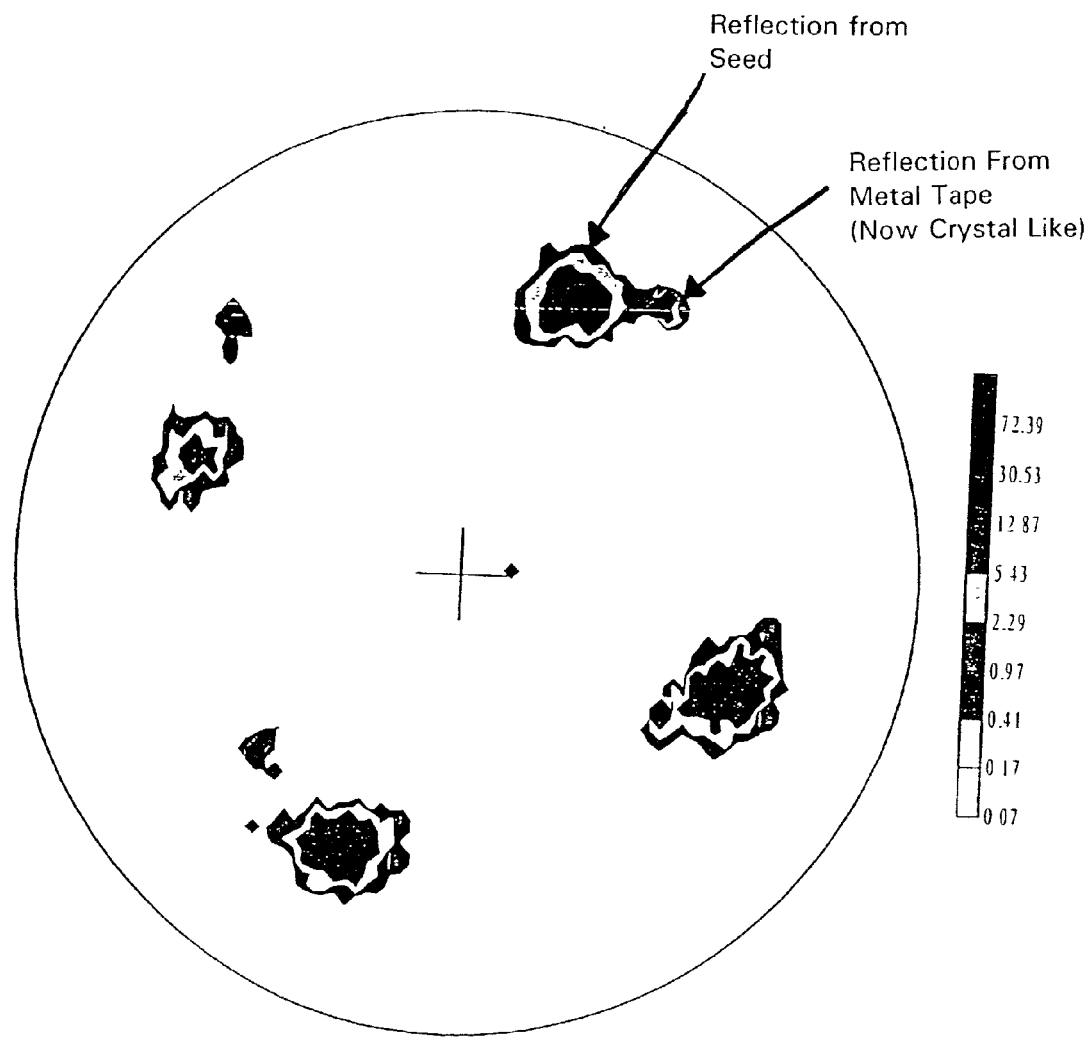
FIG. 12 illustrates the (111) X-ray pole figure of the top side of a seeded tape after annealing.

FIGS. 11 and 12 show the (111) X-ray pole figure of the back side and the top side of the seeded tape after annealing, respectively. Referring to FIG. 12, it can be seen that the seed is still intact, the more diffuse spots corresponding to the seed. The sharper peaks correspond to the 1 inch by 1 inch Ni sample. The pole figure from the back side of the metal tape shown in FIG. 11 shows the same peaks indicating the presence of a sharply biaxially textured structure, both at the location of the seed and the surrounding metal tape regions. Significantly, the orientation of the secondary recrystallized Ni is very close to the cube orientation. Near cube orientation of the secondary recrystallized Ni permits subsequent deposition of high quality epitaxial buffer layers and device layers.

Pole figures from the sample without the seed produces a single crystal which is more tilted with respect to the cube orientation {100}<100>. Thus, a secondary recrystallized near cube orientation is more compromised in the absence of a seed. In addition, a single crystal result after recrystallization is important because multiple orientation of secondary recrystallized (SR) grains generally result in high angle grain boundaries, even if the respective grains are very close to cube orientation.

EXAMPLE 9

Figure 13:
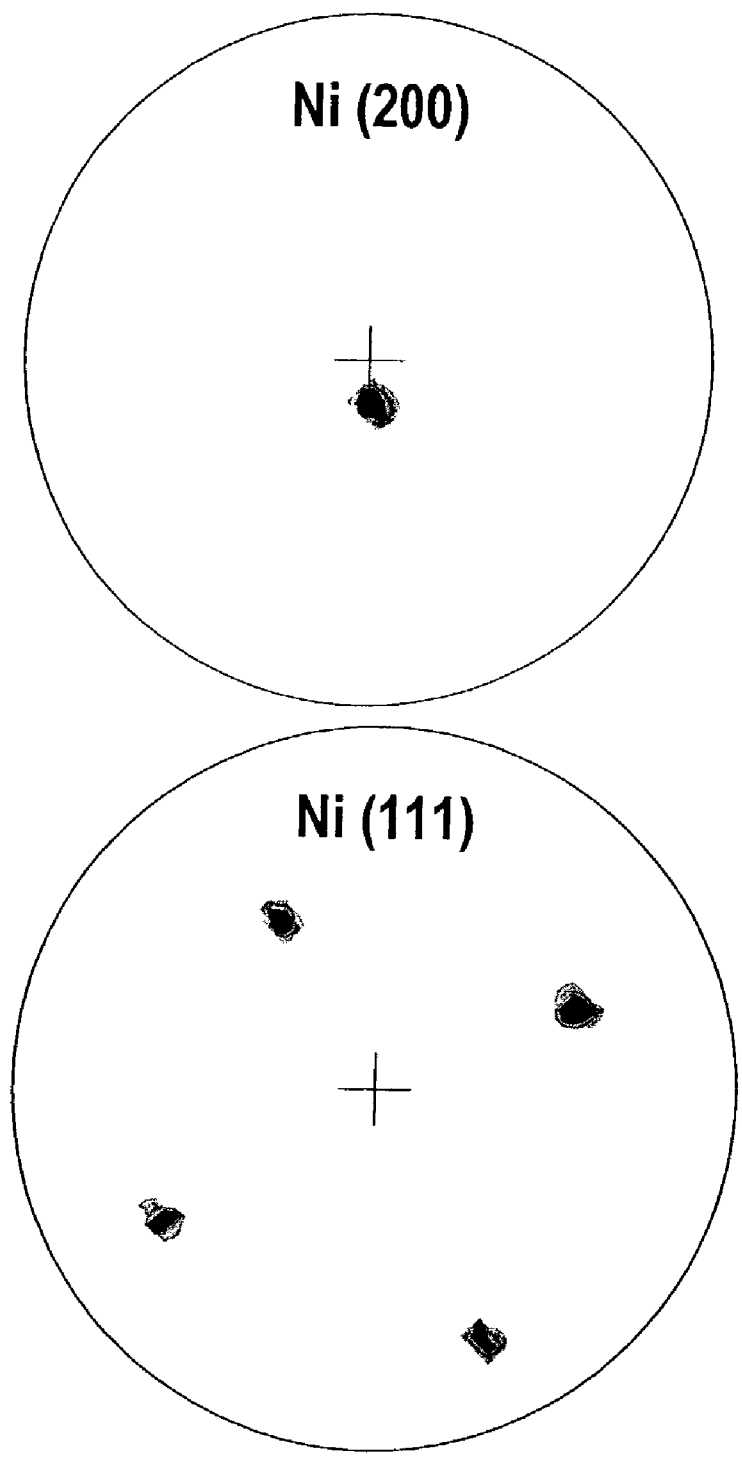
FIG. 13 illustrates Ni(200) and Ni(111) pole figures of the single crystal substrate.

FIG. 13 shows (111) and (200) pole figure of a Ni substrate fabricated by seeded secondary recrystallization. The surface of the crystal was adequately sulfurized to form a c(2×2) sulfur superstructure [13]. An epitaxial $CeO_2$ seed layer was then deposited on the substrate by electron beam evaporation. $CeO_2$ was deposited using a cerium metal source at a substrate temperature of 650° C. Oxidation of the Ni surface during the heat-up phase was prevented by the introduction of a reducing forming gas comprising 96% Ar and 4% $H_2$. Cerium oxide was formed by the in-situ reaction of the cerium with water vapor (1×10$^{-5}$ Torr) supplied to the vacuum system during deposition. A YSZ (300 nm) and $CeO_2$ (20 nm) layer were then deposited using RF sputtering while the substrate was maintained at 780° C. in 1×10$^{-2}$ Torr of forming gas and 2×10$^{-6}$ Torr of water vapor. A YBCO layer was then deposited using pulsed laser ablation.

A Lambda Physik LPX 305i excimer laser (Lambda Physik AG, Göttingen Germany) at a wavelength of 308 nm was focused on the YBCO target to produce about a 4 J/cm$^2$ influence. During deposition, the substrates were kept at 790° C. within an atmosphere of 120 mTorr $O_2$. After the deposition was completed, the samples were cooled to room temperature at the rate of 5° C./min, while the oxygen pressure was increased to 550 mTorr of $O_2$ to ensure full oxygen uptake by the YBCO films.

Figure 14:
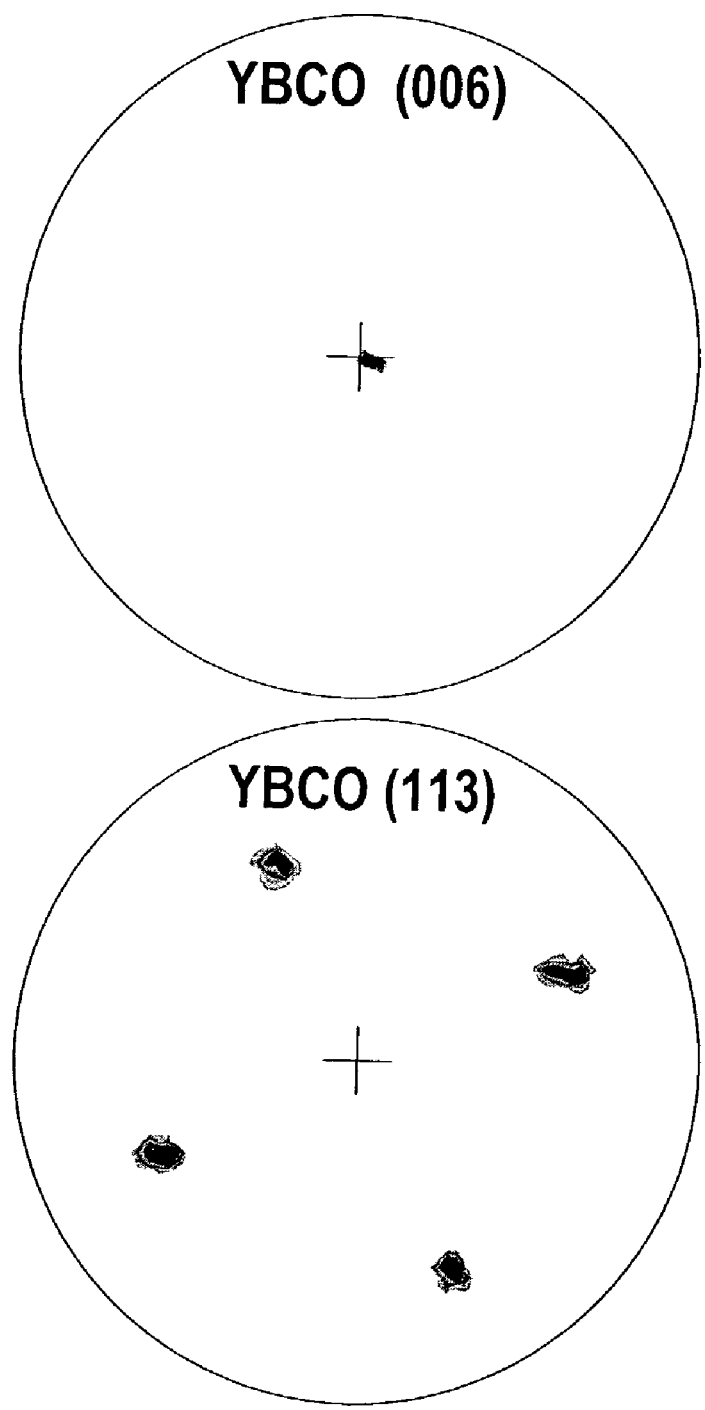
FIG. 14 illustrates YBCO (006) and YBCO (113) pole figures showing the out-of-plane and in-plane texture of an epitaxial YBCO single crystal film formed on top of a single crystal Ni substrate.

FIG. 14 shows (006) and (113) pole figures for YBCO formed. Significantly, whatever tilt existed in the seeded secondary recrystallization substrate, is now essentially removed in the YBCO film on this substrate. Thus, the YBCO film assumes essentially a texture very close to the {100}<100>, cube texture. This cube texture is generally essential for the film to have very good properties, such as very high (superconducting) current carrying ability.

Figure 15:
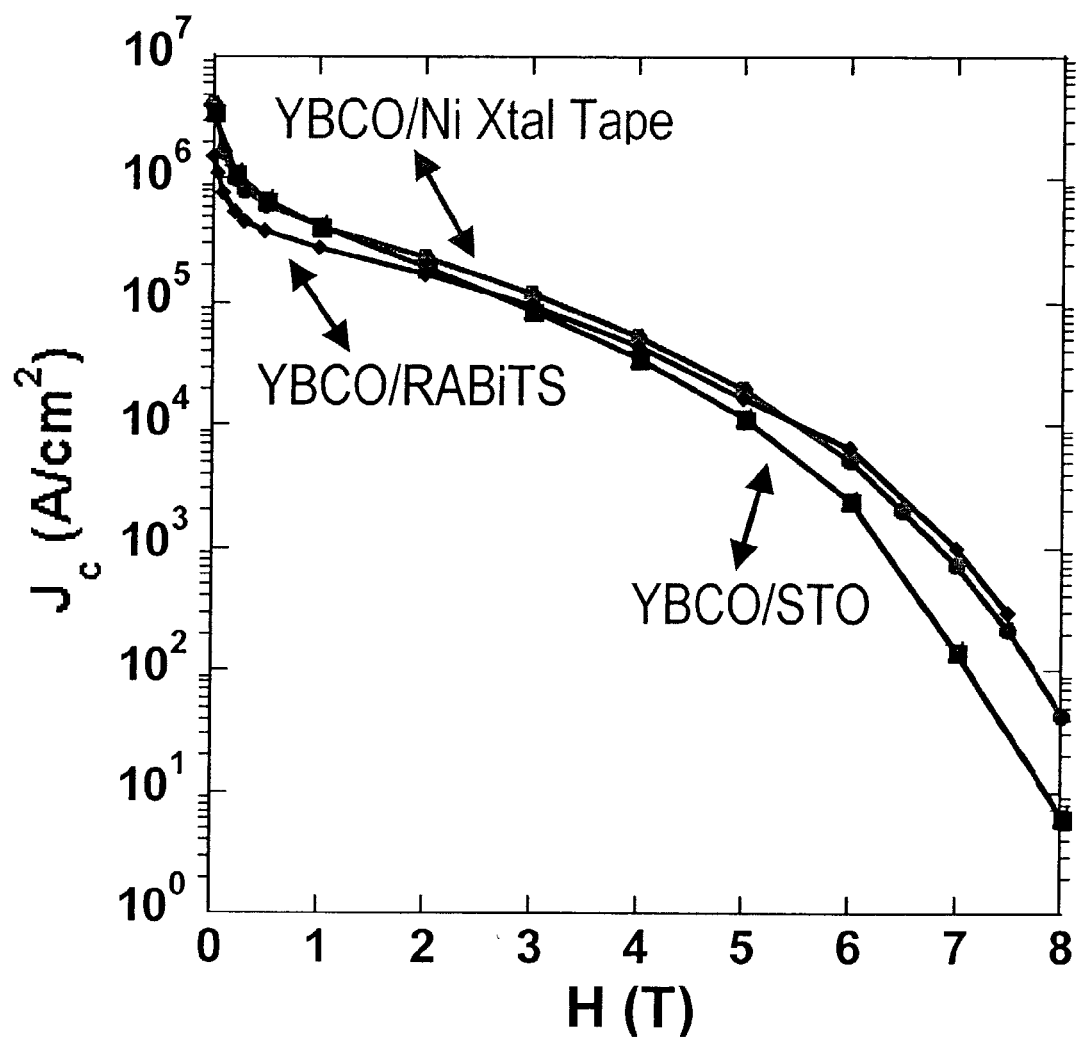
FIG. 15 illustrates the critical current density of a single crystal YBCO film formed using the invention as a function of H field strength.

As can be seen from FIG. 15, the YBCO film on the secondarily recrystallized Ni tape produced using the invention has a Jc of 4.4 million A/cm$^2$ at 77 K and self-field. Also shown in FIG. 15 for comparison is one of the best samples of YBCO on RABiTS available and a very good single crystal film of YBCO on a $SrTiO_3$ single crystal. Thus, superconducting articles producible using the invention can exhibit improved Jc values over other available techniques.

Figure 16:
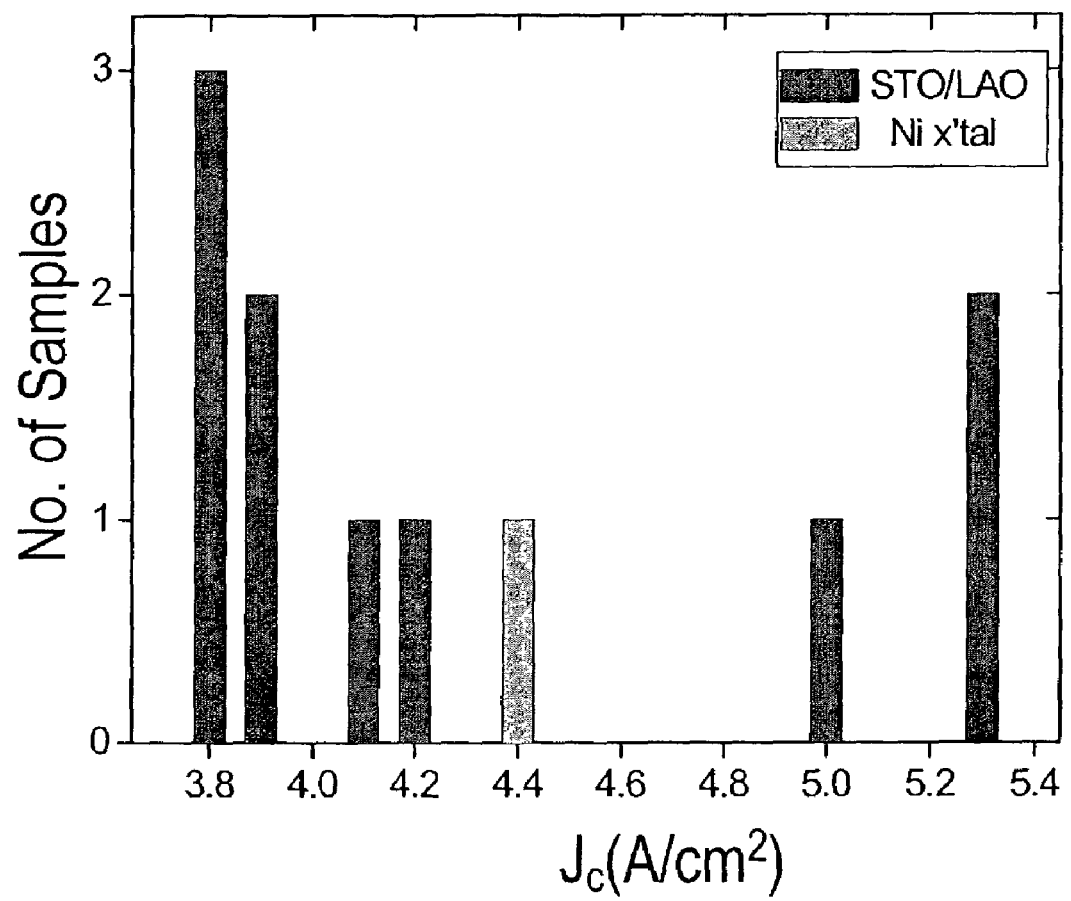
FIG. 16 illustrates the Jc distribution for YBCO on a recrystallized Ni substrate as compared to YBCO on $SrTiO_3$ and $LaAlO_3$ single crystal substrates.

FIG. 16 shows the Jc value for YBCO formed on a Ni single crystal using the invention as compared to YBCO deposited under equivalent conditions on single crystal ceramic substrates. Ceramic substrate data from the YBCO film is on either $SrTiO_3$ (STO) or $LaAlO_3$ (LAO) substrates. It can be seen that the Jc of about 4.4 million $A/cm^2$ for the YBCO film on single crystal Ni made using the process described herein is of the same quality as that of films made on expensive ceramic $SrTiO_3$ (STO) or $LaAlO_3$ (LAO) single crystals.

EXAMPLE 10

A Ni or a Ni alloy single crystal was fabricated using the conditions mentioned previously in this application. The surface of the crystal was adequately sulfurized to form a c(2×2) sulfur superstructure [13]. A buffer layer of $Y_2O_3$ was then epitaxially deposited on the substrate. YSZ and $CeO_2$ were then deposited epitaxially followed by YBCO to yield a high-Jc superconductor.

EXAMPLE 11

A Ni or a Ni alloy single crystal was fabricated using the conditions mentioned previously in this application. The surface of the crystal was adequately sulfurized to form a c(2×2) sulfur superstructure [13]. A buffer layer of $RE_2O_3$ wherein RE is a rare earth element, was then epitaxially deposited on the substrate. YSZ and $CeO_2$ were then deposited epitaxially followed by YBCO to yield a high-Jc superconductor.

EXAMPLE 12

A Ni or a Ni alloy single crystal was fabricated using the conditions mentioned previously in this application. The surface of the crystal was adequately sulfurized to form a c(2×2) sulfur superstructure [13]. A buffer layer of $LaMnO_3$ was then epitaxially deposited on the substrate. YSZ and $CeO_2$ were then deposited epitaxially followed by YBCO to yield a high-Jc superconductor.

EXAMPLE 13

A Ni or a Ni alloy single crystal was fabricated using the conditions mentioned previously in this application. The surface of the crystal was adequately sulfurized to form a c(2×2) sulfur superstructure [13]. Buffer layers were then deposited epitaxially followed by the deposition of a photovoltaic material to yield a photovoltaic device.

EXAMPLE 14

A Ni or a Ni alloy single crystal was fabricated using the conditions mentioned previously in this application. The surface of the crystal was adequately sulfurized to form a c(2×2) sulfur superstructure [13]. Buffer layers were then deposited epitaxially followed by the deposition of a ferroelectric material to form a ferroelectric device.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof. The following literature citations as well as those cited above are incorporated by reference herein for the reasons cited in the above text:

1. D. Dimos, P. Chaudhari, J. Mannhart, and F. K. LeGoues, Phys. Rev. Lett. 61, 219 (1988); D. Dimos, P. Chaudhari, and J. Mannhart, Phys. Rev. B 41, 4038 (1990).
2. A. H. Cardona, H. Suzuki, T. Yamashita, K. H. Young and L. C. Bourne, Appl. Phys. Lett., 62 (4), 411, 1993.
3. M. Kawasaki, E. Sarnelli, P. Chaudhari, A. Gupta, A. Kussmaul, J. Lacey and W. Lee, Appl Phys. Lett., 62(4), 417 (1993).
4. T. Nabatame, S. Koike, O B. Hyun, I. Hirabayashi, H. Suhara and K. Nakamura, Appl. Phys. Lett. 65 (6), 776 (1994).
5. N. Tomita, Y. Takahashi and Y. Ishida, Jpn. J. Appl. Phys., 29 (1990) L30; N. Tomita, Y. Takahashi, M. Mori and Y. Ishida, Jpn. J. Appl. Phys., 31, L942 (1992).
6. J. L. Wang, X. Y. Lin, R. J. Kelley, S. E. Babcock, D. C. Larbalestier, and M. D. Vaudin, Physica C,230,189 (1994).
7. Y. Iijima, K. Onabe, N. Futaki, N. Sadakata, O. Kohno and Y. Ikeno, J. of Appl. Phys., 74, 1905 (1993).
8. R. P. Reade et al., Appl. Phys. Lett., 61, 2231 (1992).
9. X. D. Wu, S. R. Foltyn, P. Arendt, J. Townsend, C. Adams, I. H. Campbell, P. Tiwari, Y. Coulter and D. E. Peterson, Appl. Phys. Lett., 65, 1961 (1994).
10. A. Goyal, D. P. Norton, D. M. Kroeger, D. K. Christen, M. Paranthaman, E. D. Specht, J. D. Budai, Q. He, B. Saffian, F. A. List, D. F. Lee, E. Hatfield, P. M. Martin, C. E. Clabunde, J. Mathis and C. Park, *Special 10th anniversary on High Temperature Superconductors of J. of Materials Research*, vol. 12, pgs. 2924–2940, 1997. Rev. B 41, 4038 (1990).
11. A. Goyal, S. X. Ren, E. D. Specht, D. M. Kroeger, R. Feenstra, D. P. Norton, M. Paranthaman, D. F. Lee, D. K. Christen, Micron, 30 (1999) 463.
12. R. Feenstra, T. B. Lindemeyer, J. D., Budai, and M. D. Galloway, J. Appl. Phys. 69 (9), 1 May (1991) 6569–85.
13. C. Cantoni, D. K. Christen, R. Feenstra, A. Goyal, G. W. Ownby, and D. M. Zehner and D. P. Norton, Appl. Phys. Lett., 79 (2001) 3007–3079.

We claim:

1. A method for forming single grained substrates, comprising the steps of:
   providing a deformed metal substrate having a Cu-type texture; and
   directional annealing said deformed metal substrate to a temperature higher than a secondary recrystallization temperature of said metal substrate to form a single grain substrate, said single grain having sub-grain boundaries within said grain misoriented less than 2 degrees.

2. The method of claim 1, further comprising the step of depositing an electromagnetically active epitaxial layer on said biaxially textured substrate.

3. The method of claim 1, wherein said deformed metal substrate comprises at least one metal selected from the group consisting of Cu, Co, Mo, Cd, Pd, Pt, Ag, Al, Fe and Ni, and alloys thereof.

4. The method according to claim 1, wherein said deformed metal substrate comprises at least one metal selected from the group consisting of Ni and Ni-based alloys with at least one alloying agent selected from the group consisting of Al, Co, Cr, Cu, Fe, V, Mo, W, and rare earth elements.

5. The method of claim 2, wherein said electromagnetically active layer comprises a superconducting layer.

6. The method of claim 2, wherein said electromagnetically active layer comprises a photovoltaic layer.

7. The method of claim 2, wherein said electromagnetically active layer comprises a ferroelectric layer.

8. The method of claim 5, wherein said superconducting layer comprises an oxide superconductor.

9. The method of claim 8, wherein said oxide superconductor comprises at least one selected from the group consisting of $REBa_2Cu_3O_7$, where RE is a rare earth element; $Tl_1Ba_2Ca_{n-1}Cu_nO_{2n+3}$, where n is an integer between 1 and 4; $Tl_2Ba_2Ca_{n-1}Cu_nO_{2n+4}$, where n is an integer between 1 and 4; and $Hg_1Ba_2Ca_{n-1}Cu_nO_{2n+2}$, where n is an integer between 1 and 4.

10. The method of claim 1, wherein said annealing step comprises translating said deformed substrate through a heated zone.

11. The method of claim 10, further comprising the step of providing a temperature gradient in said heated zone.

12. The method of claim 10, wherein said translating is continuous in a reel-to-reel fashion.

13. The method of claim 2, further comprising the step of depositing at least one epitaxial buffer layer on and in contact with said surface of said biaxially textured metal substrate, wherein said epitaxial electromagnetically active layer is disposed on said buffer layer.

14. The method of claim 13, wherein said epitaxial buffer layer is at least one selected from a group consisting of $CeO_2$, YSZ, $Y_2O_3$, $LaAlO_3$, $SrTiO_3$, Nb-doped $SrTiO_3$, $RE_2O_3$, where RE is a rare earth element. $LaMnO_3$, $LaCrO_3$, $LaNiO_3$, $NdGaO_3$, lanthanum zirconate (L2O), MgO, Pd, Ag, Pt and Au.

15. The method of claim 1, further comprising the step of forming an epitaxial native oxide layer by thermal oxidation of said single crystal substrate.

16. The method of claim 1, further comprising the step of depositing an epitaxial cubic nitride layer on said single crystal substrate.

17. The method of claim 16, further comprising the step of oxidizing said epitaxial nitride layer to form an epitaxial oxide layer on said single crystal substrate.

18. The method of claim 1, wherein said single grain substrate is a tape at least 1 m long.

19. The meted of claim 1, wherein said single grain substrate is a tape at least 10 m long.

20. The method of claim 1, wherein said single grain substrate is a tape at least 100 m long.

21. The method of claim 1, wherein said angle grain substrate is a tape at least 1 km long.

22. The method of claim 1, wherein said providing step includes rolling a metal substrate to form said deformed metal substrate.

23. The method of claim 1, wherein said providing step includes hot or cold wire drawing, hot or cold rolling, and hot or cold forging a metal substrate to form said deformed metal substrate.

24. The method of claim 1 wherein the secondary recrystallized substrate has no grain boundaries transverse to the length of said single grain substrate tape.

25. A method for forming single grained substrates, comprising the step of:
providing a deformed metal substrate having a Cu-type texture;
annealing said deformed metal substrate to a temperature higher than a secondary recrystallization temperature of said metal substrate to form a single crystal substrate; and forming an assembly by placing at least one textured seed on said deformed substrate, said seed selected to have a stable texture at temperatures below said secondary recrystallization temperature wherein during said annealing step at least one grain of said metal substrate is nucleated at said seed to form said single crystal substrate.

26. The method of claim 25, further comprising the step of depositing an electromagnetically active epitaxial layer on said single crystal substrate.

27. The method of claim 25, wherein said deformed metal substrate comprises at least one metal selected from the group consisting of Cu, Co, Mo, Cd, Pd, Pt, Ag, Al, and Ni, and alloys thereof.

28. The method according to claim 25, wherein said deformed metal substrate comprises at least one metal selected from the group consisting of Ni and Ni-based alloys with at least one alloying agent selected from the group consisting of Al, Co, Cr, Cu, Fe, V, Mo, W, and rare earth elements.

29. The method of claim 26, wherein said electromagnetically active layer comprises a superconducting layer.

30. The method of claim 26, wherein said electromagnetically active layer comprises a photovoltaic layer.

31. The method of claim 26, wherein said electromagnetically active layer comprises a ferroelectric layer.

32. The method according to claim 29, wherein said superconducting layer comprises an oxide superconductor.

33. The method according to claim 32, wherein said oxide superconductor comprises at least one selected from the group consisting of $REBa_2Cu_3O_7$, where RE is a rare earth element; $Tl_1Ba_2Ca_{n-1}Cu_nO_{2n+3}$, where n is an integer between 1 and 4; $Tl_2Ba_2Ca_{n-1}Cu_nO_{2n+4}$, where n is an integer between 1 and 4; and $Hg_1Ba_2Ca_{n-1}Cu_nO_{2n+2}$, where n is an integer between 1 and 4.

34. The method of claim 25, wherein said annealing step comprises translating said deformed substrate through a heated zone.

35. The method of claim 34, further comprising the step of providing a temperature gradient in said heated zone.

36. The method of claim 34, wherein said translating is continuous in a reel-to-reel fashion.

37. The method of claim 26, further comprising the step of depositing at least one epitaxial buffer layer on and in contact with said surface of said single crystal substrate, wherein said epitaxial electromagnetically active layer is disposed on said buffer layer.

38. The method according to claim 32, wherein said oxide superconductor comprises at least one selected from the group consisting of $REBa_2Cu_3O_7$, where RE is a rare earth element; $Tl_1Ba_2Ca_{n-1}Cu_nO_{2n+3}$, where n is an integer between 1 and 4; $Tl_2Ba_2Ca_{n-1}Cu_nO_{2n+4}$, where n is an integer between 1 and 4; and $Hg_1Ba_2Ca_{n-1}Cu_nO_{2n+2}$, where n is an integer between 1 and 4.

39. The method of claim 25, further comprising forming a native oxide layer by thermal oxidation of said single crystal substrate.

40. The method of claim 25, further comprising the step of depositing an epitaxial, cubic nitride layer on said single crystal substrate.

41. The method of claim 40, further comprising the step of oxidizing said epitaxial nitride layer to form a epitaxial oxide layer on said single crystal substrate.

42. The method of claim 25, wherein said deformed metal substrate is a tape.

43. The method of claim 42, wherein said tape is at least 100 m long.

44. The method of claim 42, wherein said tape is at least 1 km long.

45. The method of claim 25, wherein said providing step includes rolling a metal substrate to form said deformed metal substrate.

46. The method of claim 25, wherein said providing step includes hot or cold wire drawing, hot or cold rolling, and hot or cold forging a metal substrate to form said deformed metal substrate.

47. The method of claim 25, wherein said deformed metal substrate and said textured seed comprise different materials.

48. A metallic substrate tape, comprising:
a single grain substrate, said single grain substrate having sub-grain boundaries within said grain misoriented less than 2 degrees and having a length of at least 0.1 m.

49. The tape of claim 48, wherein said tape has no grain boundaries transverse of perpendicular to a length of said substrate tape.

50. The tape of claim 48, wherein said single grain metallic substrate tape comprises at least one metal selected from the group consisting of Cu, Co, Mo, Cd, Pd, Pt, Ag, Al, Fe and Ni, and alloys thereof.

51. The tape of claim 48, wherein said single grain metallic substrate tape comprises at least one metal selected from the group consisting of Ni and Ni-based alloys with at least one alloying agent selected from the group consisting of Al, Co, Cr, Cu, Fe, V, Mo, W, and rare earth elements.

52. The tape of claim 48, wherein said tape is at least 10 m long.

53. The tape of claim 48, wherein said tape is at least 100 m long.

54. An epitaxial tape article, comprising:
a single grain substrate tape having a length of at least 0.1 m, said single grain substrate having sub-grain boundaries within said grain misoriented less than 2 degrees, and
at least one epitaxial layer disposed on said tape.

55. The article of claim 54, wherein said epitaxial layer comprises at least one buffer layer.

56. The article of claim 54, wherein said epitaxial layer comprises an electromagnetically active layer.

57. The article of claim 54, wherein said electromagnetically active layer is disposed on and in contact with said tape.

58. The article of claim 56, wherein said electromagnetically active layer is a photovoltaic material or a ferroelectric material.

59. The article of claim 56, wherein said electromagnetically active layer comprises a superconducting layer.

60. The article of claim 59, wherein said superconducting layer comprises an oxide superconductor.

61. The article claim 60, wherein said oxide superconductor comprises at least one selected from the group consisting of $REBa_2Cu_3O_7$, where RE is a rare earth element; $Tl_1Ba_2Ca_{n-1}Cu_nO_{2n+3}$, where n is an integer between 1 and 4; $Tl_2Ba_2Ca_{n-1}Cu_nO_{2n+4}$ where n is an integer between 1 and 4, and $Hg_1Ba_2Ca_{n-1}Cu_nO_{2n+2}$, where n is an integer between 1 and 4.

62. The article of claim 54, wherein said tape comprises at least one metal selected from the group consisting of Cu, Co, Mo, Cd, Pd, Pt, Ag, Al, and Ni, and alloys thereof.

63. The article of claim 54, wherein said tape comprises at least one metal selected from the group consisting of Ni and Ni-based alloys with at least one alloying agent selected from the group consisting of Co, Cr, V, Mo, W, and rare earth elements.

64. The article of claim 54, wherein said tape comprises a Ni or a Ni-alloy single grain tape and said epitaxial layer comprises an oxide, nitride or carbide layer.

65. The article of claim 54, wherein said tape comprises Ni or Ni-alloy single grain tape and said epitaxial layer comprises at least one selected from the group consisting of $CeO_2$, $Y_2O_3$, lanthanum zirconate, $SrTiO_3$, Nb-doped $SrTiO_3$, $RE_2O_3$, where RE is a rare earth element, $LaMnO_3$, $LaCrO_3$, $LaNiO_3$, $NdGaO_3$, $LaAlO_3$, YSZ and MgO.

66. The article of claim 54, further comprising an epitaxial layer of an oxide thermally grown on said substrate tape.

67. The article of claim 65, further comprising an epitaxial superconductor layer disposed on said epitaxial layer.

68. The article of claim 65, further comprising a photovoltaic layer or a ferroelectric layer disposed on said epitaxial layer.

69. The article of claim 54, wherein said epitaxial layer comprises $Y_2O_3$ or $CeO_2$, further comprising an epitaxial superconductor layer disposed on said epitaxial layer.

70. The article of claim 54, wherein said epitaxial layer comprises at least 2 buffer layers, said buffer layers comprising a layer of YSZ and a layer of $CeO_2$.

71. The article of claim 70, further comprising an epitaxial superconductor layer disposed on said epitaxial layer.

72. The article of claim 71, wherein the angle between the (002) reflection of said metal substrate and the normal of said tape is greater than the angle between the (002) reflection of the tope epitaxial layer and said normal to said tape.

73. The article of claim 71, wherein the angle between the (002) reflection of said metal substrate and a normal of said tape is greater than the angle between the (006) reflection of said superconductor layer and said normal of said tape.

* * * * *